(12) United States Patent
Hemink

(10) Patent No.: US 8,254,177 B2
(45) Date of Patent: Aug. 28, 2012

(54) PROGRAMMING NON-VOLATILE MEMORY WITH VARIABLE INITIAL PROGRAMMING PULSE

(75) Inventor: Gerrit Jan Hemink, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 612 days.

(21) Appl. No.: 12/427,007

(22) Filed: Apr. 21, 2009

(65) Prior Publication Data
US 2010/0103733 A1    Apr. 29, 2010

Related U.S. Application Data

(60) Provisional application No. 61/108,124, filed on Oct. 24, 2008.

(51) Int. Cl.
*G11C 16/04* (2006.01)

(52) U.S. Cl. .......... 365/185.19; 365/185.03; 365/185.22

(58) Field of Classification Search ............. 365/185.19, 365/185.03, 185.22
See application file for complete search history.

(56) References Cited

U.S. PATENT DOCUMENTS

| | | |
|---|---|---|
| 5,070,032 A | 12/1991 | Yuan |
| 5,095,344 A | 3/1992 | Harari |
| 5,172,338 A | 12/1992 | Mehrotra |
| 5,313,421 A | 5/1994 | Guterman |
| 5,315,541 A | 5/1994 | Harari |
| 5,343,063 A | 8/1994 | Yuan |
| 5,570,315 A | 10/1996 | Tanaka |
| 5,595,924 A | 1/1997 | Yuan |
| 5,661,053 A | 8/1997 | Yuan |
| 5,768,192 A | 6/1998 | Eitan |
| 5,903,495 A | 5/1999 | Takeuchi |
| 6,011,725 A | 1/2000 | Eitan |
| 6,046,935 A | 4/2000 | Takeuchi |
| 6,185,134 B1 | 2/2001 | Tanaka |
| 6,222,762 B1 | 4/2001 | Guterman |
| 7,092,290 B2 | 8/2006 | Hemink |
| 7,177,199 B2 | 2/2007 | Chen |
| 7,230,854 B2 | 6/2007 | Wan |
| 7,243,275 B2 | 7/2007 | Gongwer |

(Continued)

FOREIGN PATENT DOCUMENTS

EP          1227501 A      7/2002

(Continued)

OTHER PUBLICATIONS

International Search Report, dated Nov. 24, 2009, PCT/US2009/058874.

(Continued)

*Primary Examiner* — Toan Le
(74) *Attorney, Agent, or Firm* — Vierra Magen Marcus & DeNiro LLP

(57) ABSTRACT

Multiple programming processes are performed for a plurality of non-volatile storage elements. Each of the programming process operates to program at least a subset of the non-volatile storage elements to a set of target conditions using programming pulses. For at least a subset of the programming processes, a programming pulse associated with achieving an intermediate result for a respective programming process is identified, a pulse increment between programming pulses is decreased for the respective programming process while continuing the respective programming process to program non-volatile storage elements to the respective one or more targets and the identified programming pulse is used to adjust a starting programming voltage for a subsequent programming process.

30 Claims, 21 Drawing Sheets

U.S. PATENT DOCUMENTS

| | | |
|---|---|---|
| 7,339,834 B2 | 3/2008 | Lutze |
| 7,434,111 B2 | 10/2008 | Sugiura |
| 7,450,426 B2 | 11/2008 | Li |
| 7,451,264 B2 | 11/2008 | Yero |
| 7,467,253 B2 | 12/2008 | Yero |
| 7,474,561 B2 | 1/2009 | Li |
| 2005/0286304 A1 | 12/2005 | Krishnamachari et al. |
| 2006/0140007 A1 | 6/2006 | Cernea |
| 2007/0263450 A1 | 11/2007 | Cernea |
| 2007/0297247 A1 | 12/2007 | Hemink |
| 2008/0062770 A1 | 3/2008 | Tu |
| 2008/0101126 A1 | 5/2008 | Hemink |
| 2008/0130368 A1* | 6/2008 | Lutze ................ 365/185.19 |
| 2008/0158979 A1 | 7/2008 | Kamei |
| 2008/0198660 A1 | 8/2008 | Mokhlesi |
| 2008/0198661 A1 | 8/2008 | Mokhlesi |
| 2008/0198662 A1 | 8/2008 | Mokhlesi |
| 2008/0198664 A1 | 8/2008 | Mokhlesi |
| 2008/0198665 A1 | 8/2008 | Mokhlesi |

FOREIGN PATENT DOCUMENTS

| | | |
|---|---|---|
| WO | WO2005/041206 A | 5/2005 |

OTHER PUBLICATIONS

Written Opinion of the International Searching Authority, dated Nov. 24 2009, PCT/US2009/058874.

Seung-Ho Chang et al. "A 48nm 32Gb 8-level NAND flash Memory with 5.5 MB/s Program Throughput," ISSCC 2009, 2009 IEEE International Solid State Circuits Conference, Feb. 10, 2009.

* cited by examiner

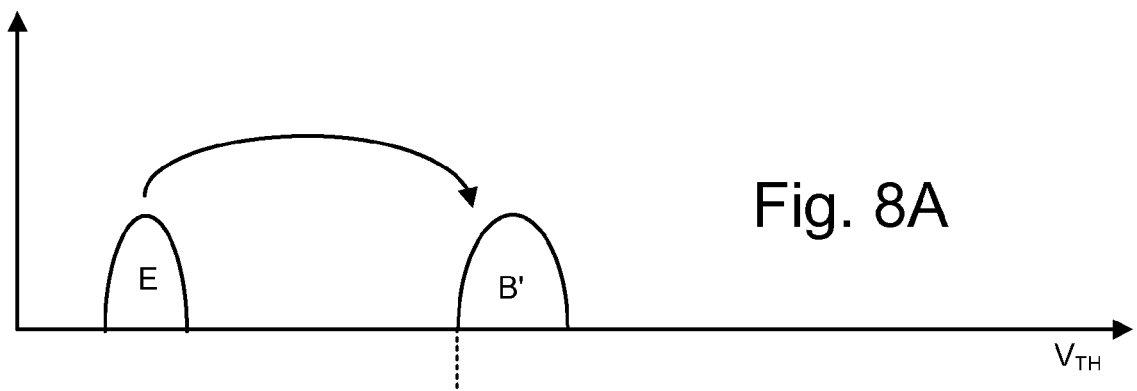
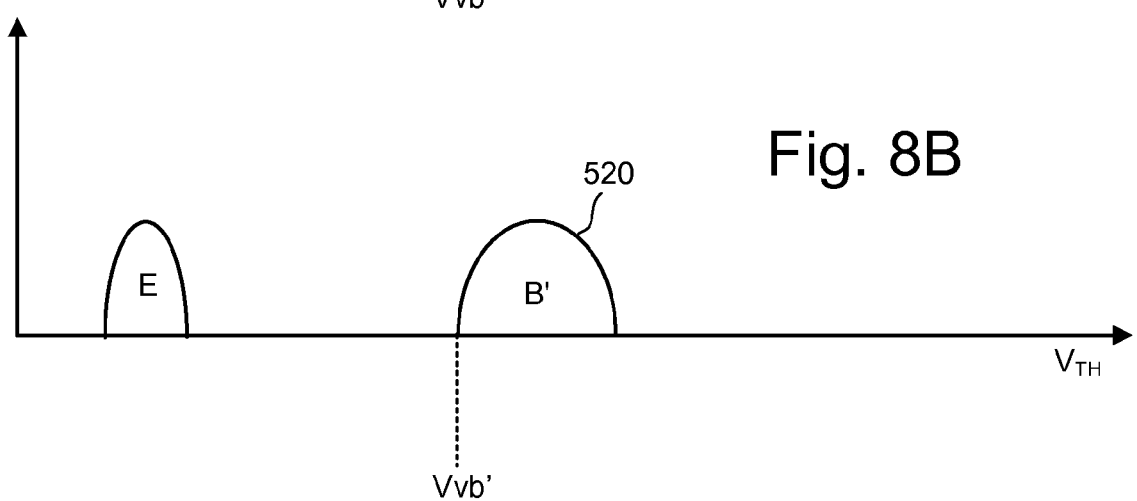
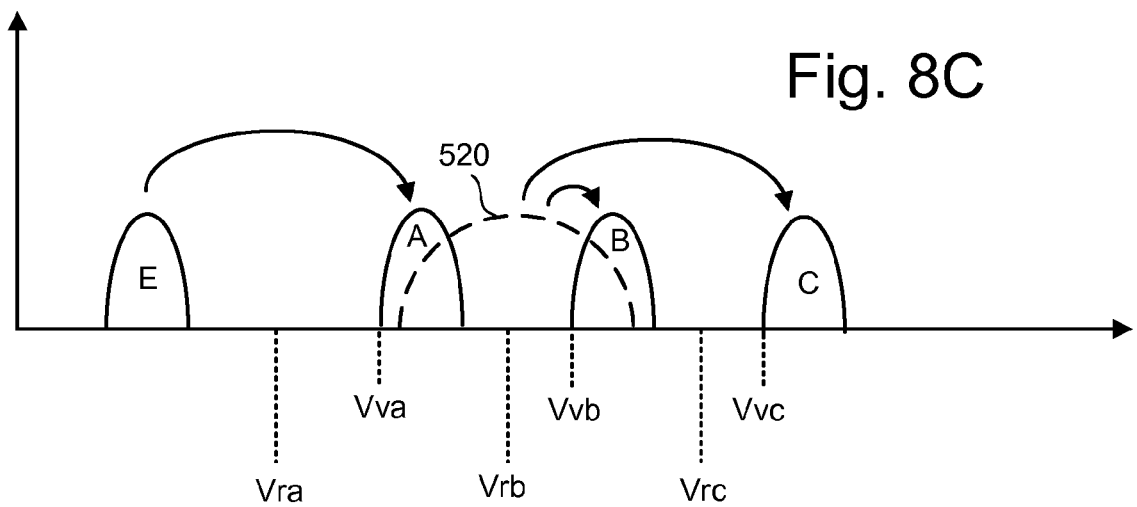

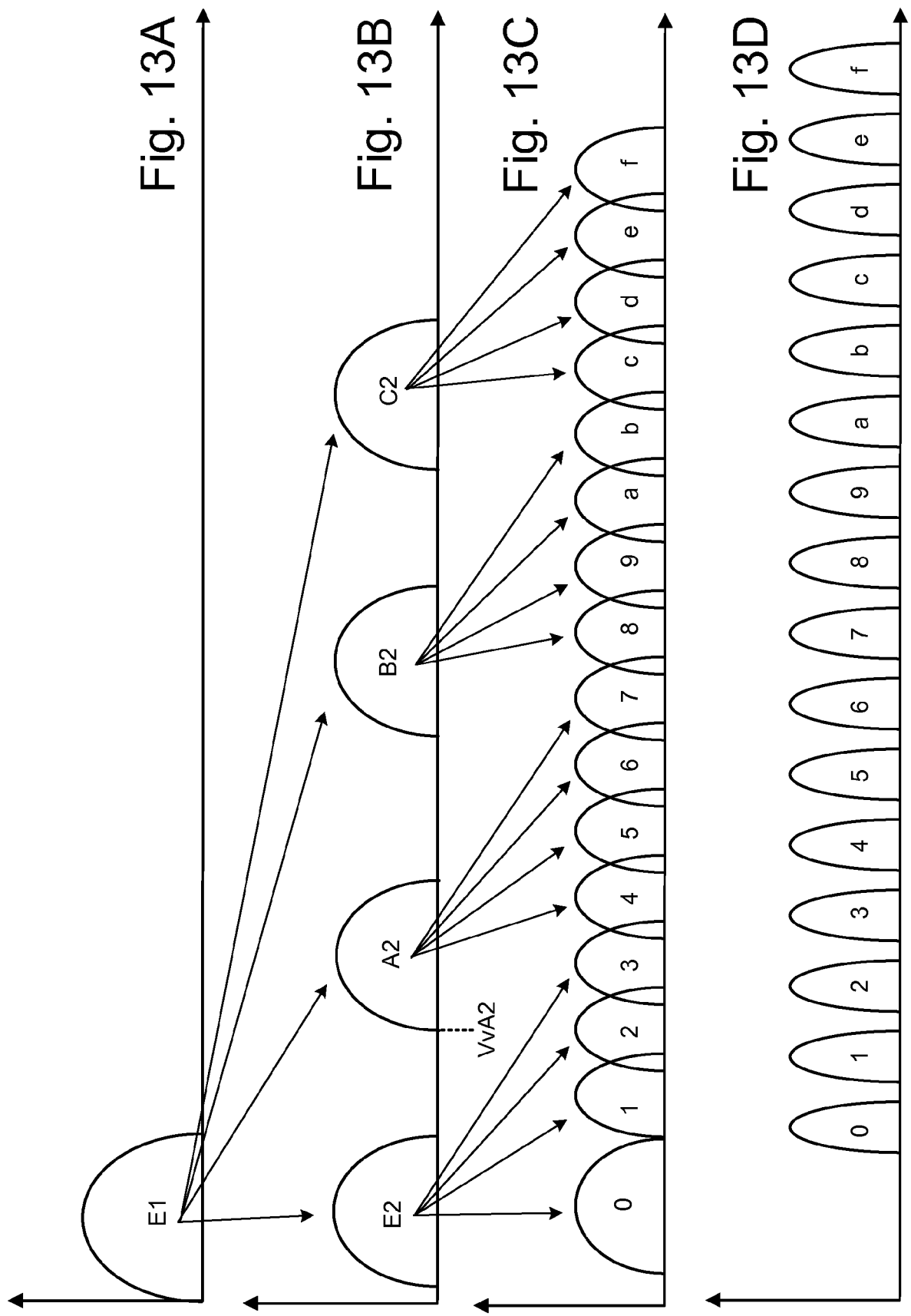

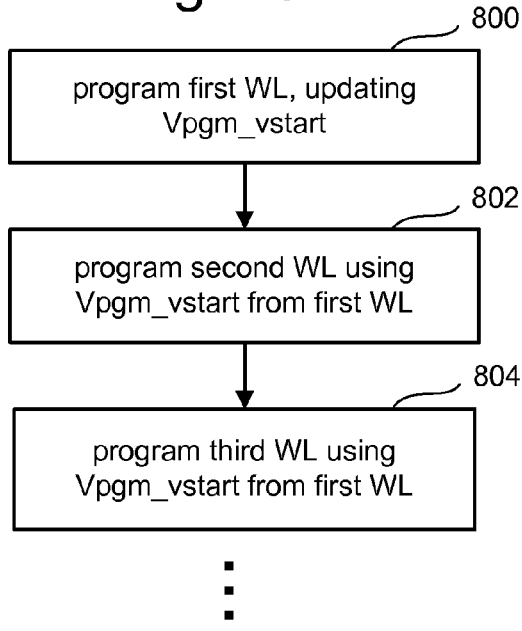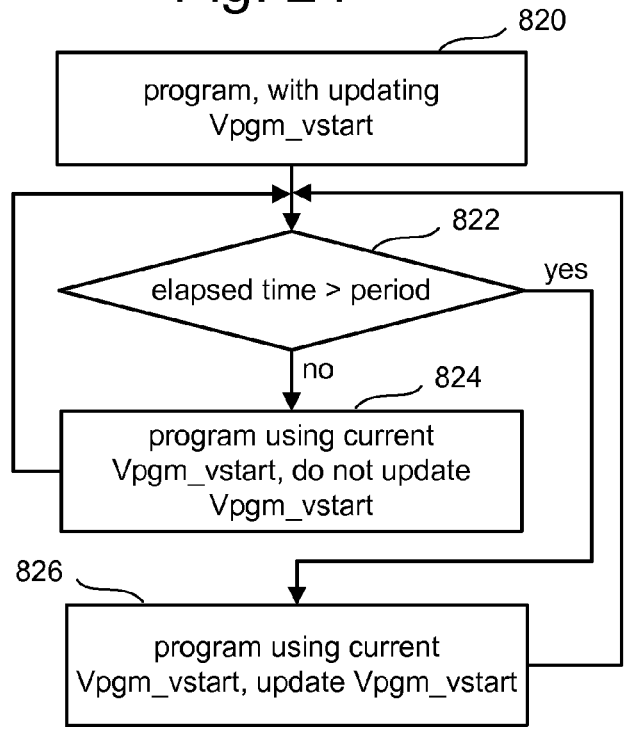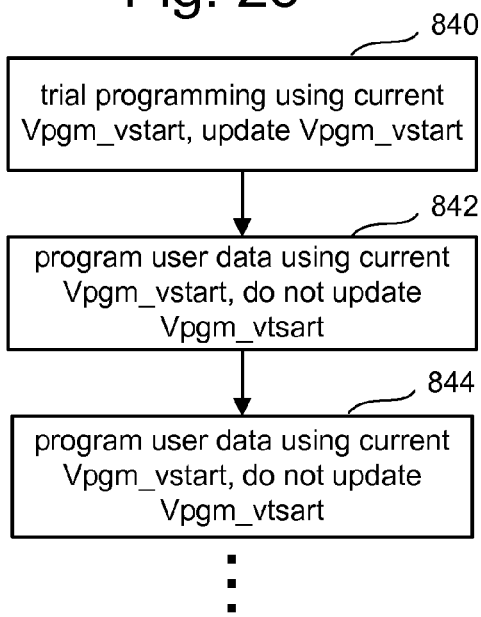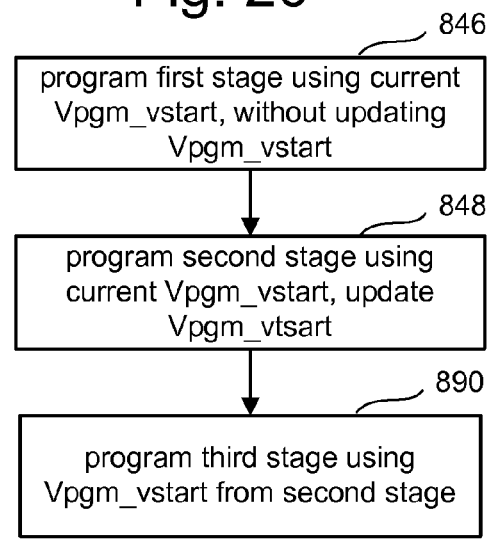

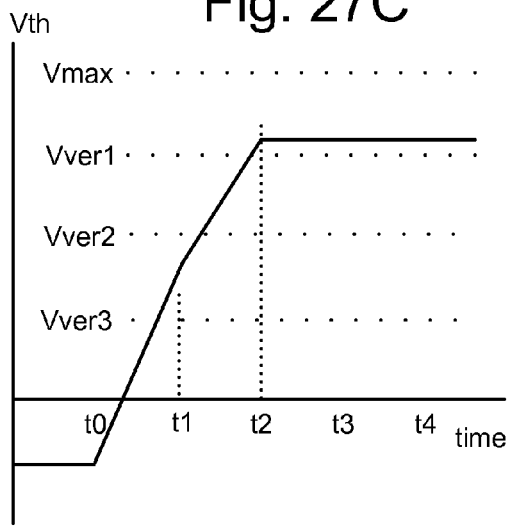
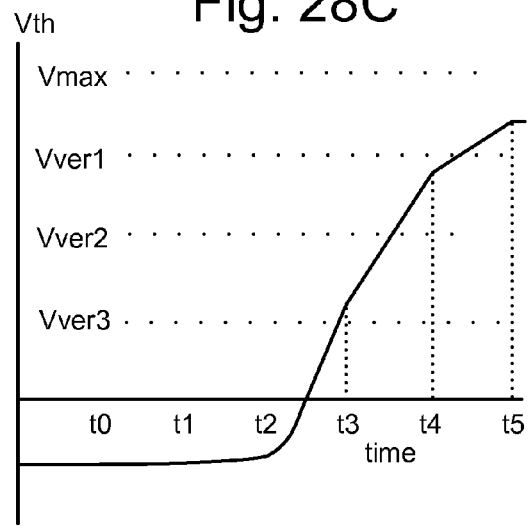
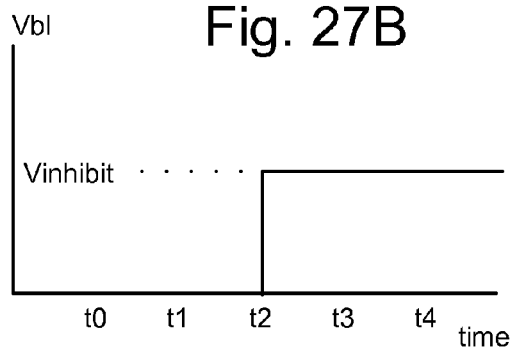
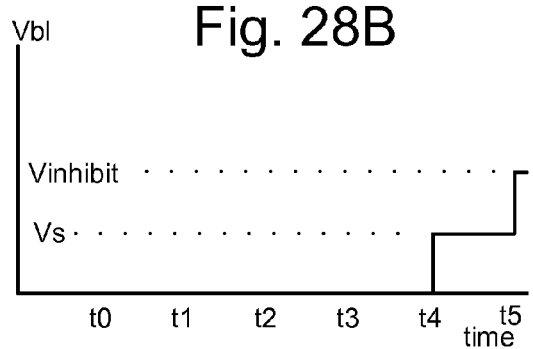
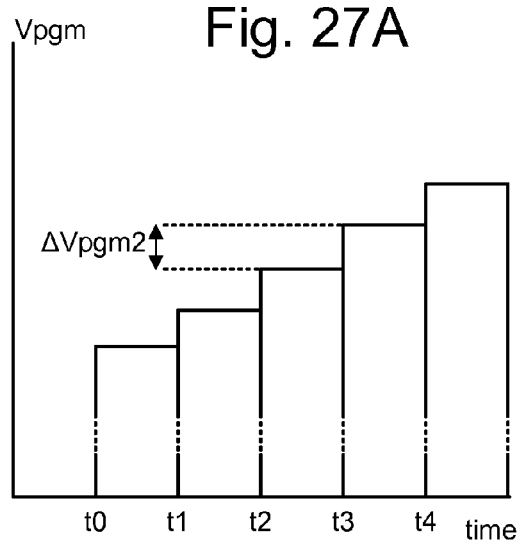
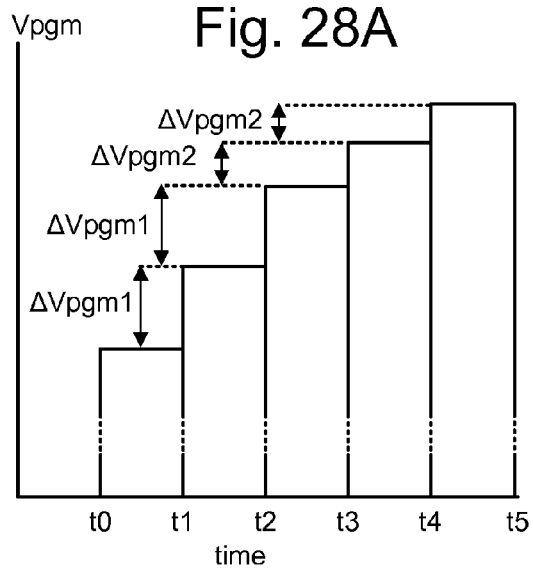

PROGRAMMING NON-VOLATILE MEMORY WITH VARIABLE INITIAL PROGRAMMING PULSE

This application claims the benefit of U.S. Provisional Application No. 61/108,124, "Programming Non-Volatile Memory With Variable Initial Programming Pulse," by Gerrit Jan Hemink, filed on Oct. 24, 2008, incorporated herein by reference.

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2v, 0.3v, 0.4v, or others). The choice of the magnitude of program voltage is a compromise. Too high of a magnitude will result in some memory cells being over-programmed, while too low of a magnitude will result in longer programming times. Typically, users of non-volatile memory desire that the memory program quickly.

In the prior art devices, the same program signal is used for new devices that have not been significantly used (also called fresh devices) and heavily used devices. However, as a non-volatile memory device undergoes many programming cycles, charge becomes trapped in the insulation between the floating gate and the channel region. This trapping of charge shifts the threshold voltage to a higher level, which allows the memory cell to program quicker. If the magnitude of the program voltage is set too high, even though it does not result in over programming of a fresh device, as that device becomes more heavily used then that device may experience over programming. Thus, new devices will have their program voltage set low enough to avoid over programming when the device is older. This lowering of the magnitude of the program voltage will reduce the speed at which the fresh device programs data.

SUMMARY OF THE INVENTION

The technology described herein attempts to increase the speed of programming while reducing the risk of over-programming.

One embodiment includes performing multiple programming processes for a plurality of non-volatile storage elements. Each of the programming process operate to program at least a subset of the non-volatile storage elements to a respective set of target conditions using programming pulses. For at least a subset of the programming processes, the method includes identifying a programming pulse associated with achieving an intermediate result for a respective programming process, decreasing a pulse increment between programming pulses for the respective programming process while continuing the respective programming process to program non-volatile storage elements to respective one or more target conditions, and using the identified programming pulse to adjust a starting program voltage for a subsequent programming process for the non-volatile storage elements.

One embodiment includes programming a first set of non-volatile storage elements to a first set of one or more target conditions using a first set of programming pulses, and completing the programming of the first set of non-volatile storage elements to the first set of one or more target conditions prior to starting programming of other non-volatile storage elements after starting the programming of the first set of non-volatile storage elements to the first set of one or more target conditions. During the programming of the first set of non-volatile storage elements to the first set of one or more target conditions, a determination is made that at least a subset of the first set of non-volatile storage elements have reached a first intermediate condition in response to a nth programming pulse of the first set of programming pulses and the pulse magnitude increment for the first set of programming pulses is decreased for additional programming using the first set of programming pulses to complete the programming of the first set of non-volatile storage elements to the first set of one or more target conditions. The method further includes storing an indication based on the nth programming pulse and, after completing the programming of the first set of non-volatile storage elements to the first set of one or more target conditions, programming one or more non-volatile storage elements to a second set of one or more target conditions using a second set of programming pulses. The second set of programming pulses includes a first pulse having a magnitude based on the stored indication.

One embodiment includes a plurality of non-volatile storage elements and one or more managing circuits in communication with the plurality of non-volatile storage elements. The one or more managing circuits apply programming pulses with a first increment between pulses to a set of the non-volatile storage elements and determine that at least a first subset of the set of non-volatile storage elements have reached a first threshold voltage level in response to a nth programming pulse. The one or more managing circuits store an indication based on the nth programming pulse. The one or more managing circuits apply programming pulses with a second increment between pulses to the set of non-volatile storage elements until a sufficient number of the set of non-volatile storage elements have reached one or more respective target conditions. The first increment between pulses is larger than the second increment between pulses. The first threshold voltage level is lower than threshold voltage levels used to lockout non-volatile storage elements from programming. The one or more managing circuits perform another programming process for one or more non-volatile storage elements using a set of programming pulses having a first pulse with a magnitude based on the stored indication.

One embodiment includes performing a first stage of a multi-stage programming process on a set of non-volatile storage elements. The multi-stage programming process programs the set of non-volatile storage elements to one or more final target conditions. The first stage programs the non-volatile storage elements to one or more first stage target conditions. The performing of the first stage includes applying a first set of programming pulses to the non-volatile storage elements with a first increment between programming pulses, determining that at least a subset of the non-volatile storage elements have reached an intermediate condition for the first stage in response to a nth programming pulse of the first set of programming pulses (the intermediate condition for the first stage is different than the one or more first stage target conditions), changing the first set of programming pulses to have a second increment between programming pulses in response to determining that the subset of the non-volatile storage elements have reached the intermediate condition for the first stage, storing an indication based on the nth programming pulse and terminating the first stage when a sufficient number of the non-volatile storage elements have reached the respective one or more first stage target conditions. The method further includes performing an additional stage of the multi-stage programming process including applying a second set of programming pulses having an initial pulse with a magnitude set based on the stored indication. The second increment between programming pulses is smaller than the first increment between programming pulses.

One embodiment includes applying programming pulses with a first increment between pulses to a set of non-volatile storage elements, determining that at least a first subset of the set of non-volatile storage elements have reached a first threshold voltage level, (in response to determining that at least the first subset of the set of non-volatile storage elements have reached the first threshold voltage level) applying programming pulses with a second increment between pulses to the set of non-volatile storage elements until a sufficient number of the set of non-volatile storage elements have reached one or more respective target conditions, and performing another programming process for one or more non-volatile storage elements using a set of programming pulses having a first pulse with a magnitude based on the determining that at least the first subset of the set of non-volatile storage elements have reached the first threshold voltage level. The first increment between pulses is larger than the second increment between pulses. The first threshold voltage level is lower than threshold voltage levels used to lockout non-volatile storage elements from programming.

One embodiment includes a plurality of non-volatile storage elements and one or more managing circuits in communication with the plurality of non-volatile storage elements. The one or more managing circuits use a first set of programming pulses to program a set of the plurality of non-volatile storage elements to a first set of one or more target conditions associated with the first set of programming pulses. During the programming of the set of non-volatile storage elements to the first set of one or more target conditions, the one or more managing circuits determine that at least a subset of the first set of non-volatile storage elements have reached a first intermediate condition with respect to the first set of programming pulses in response to a particular programming pulse of the first set of programming pulses and decrease increment between pulses for the first set of programming pulses during continued programming of the set of non-volatile storage elements to the first set of one or more target conditions. The one or more managing circuits store an indication based on the particular programming pulse. The one or more managing circuits program one or more of the plurality of non-volatile storage elements to a second set of one or more target conditions using a second set of programming pulses. The second set of programming pulses has a first pulse with a magnitude based on the stored indication.

One embodiment includes performing a first stage of a multi-stage programming process on a set of non-volatile storage elements. The multi-stage programming process programs the set of non-volatile storage elements to one or more final target conditions. The first stage programs a plurality of the non-volatile storage elements to one or more first stage target conditions. The performing of the first stage includes applying a first set of programming pulses to the plurality of the non-volatile storage elements with a first increment between programming pulses, determining that at least a subset of the plurality of the non-volatile storage elements have reached an intermediate condition for the first stage (the intermediate condition for the first stage is different than the one or more first stage target conditions), changing the first set of programming pulses to have a second increment between programming pulses in response to determining that the subset of the non-volatile storage elements have reached the intermediate condition for the first stage, determining that a sufficient number of the plurality of the non-volatile storage elements have reached the one or more first stage target conditions, terminating the first stage, and storing an indication of a programming pulse applied immediately prior to determining that the sufficient number of the plurality of the non-volatile storage elements have reached the one or more first stage target conditions. The process further includes performing an additional stage of the multi-stage programming process including applying a second set of programming pulses to a group of the non-volatile storage elements. The second set of programming pulses has an initial pulse with a magnitude based on the stored indication. The second increment between programming pulses is equal to or smaller than the first increment between programming pulses.

BRIEF DESCRIPTION OF THE DRAWINGS

FIGS. 8A-8C depict examples of threshold voltage distributions and an example programming process.

FIGS. 13A-13D depict examples of threshold voltage distributions and an example programming process.

FIGS. 19-26 are flow charts describing various embodiments for performing programming processes.

FIGS. 27A-C and 28A-C are graphs that explain a coarse/fine programming scheme.

DETAILED DESCRIPTION

Figure 1:
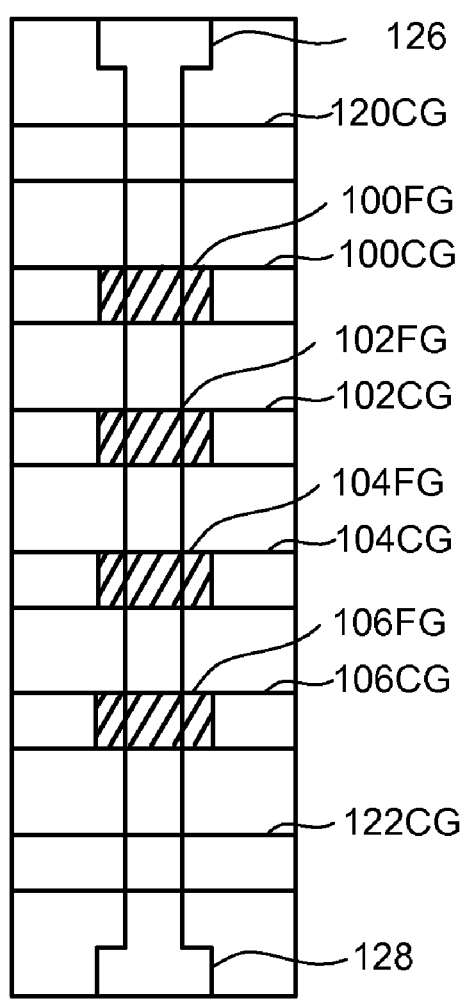
FIG. 1 is a top view of a NAND string.
Figure 2:
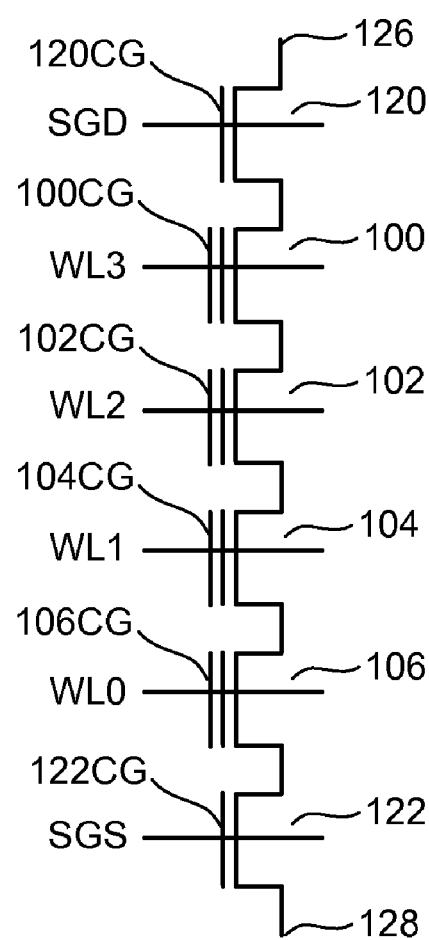
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. Nos. 5,570,315; 5,774,397; 6,046,935; 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
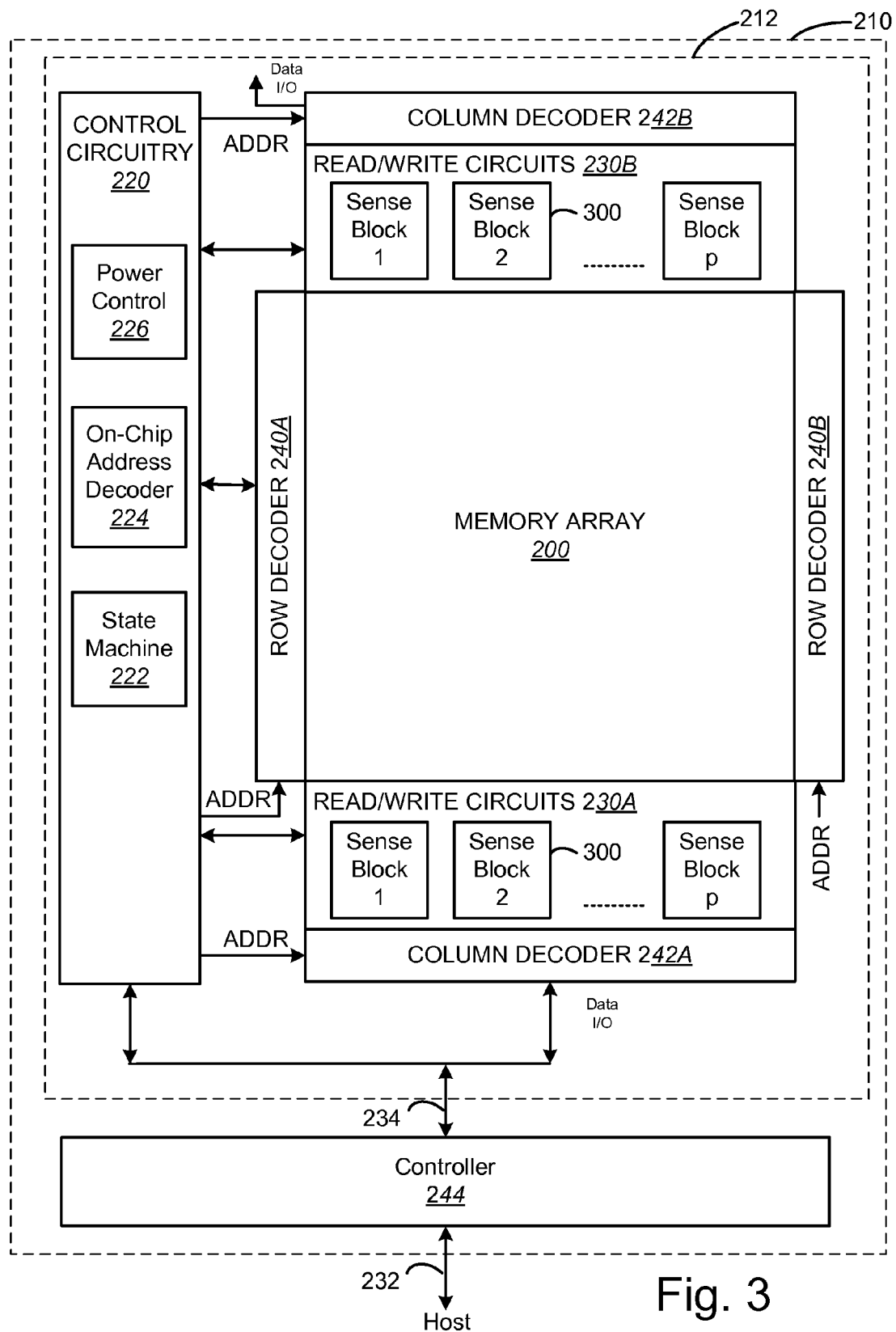
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
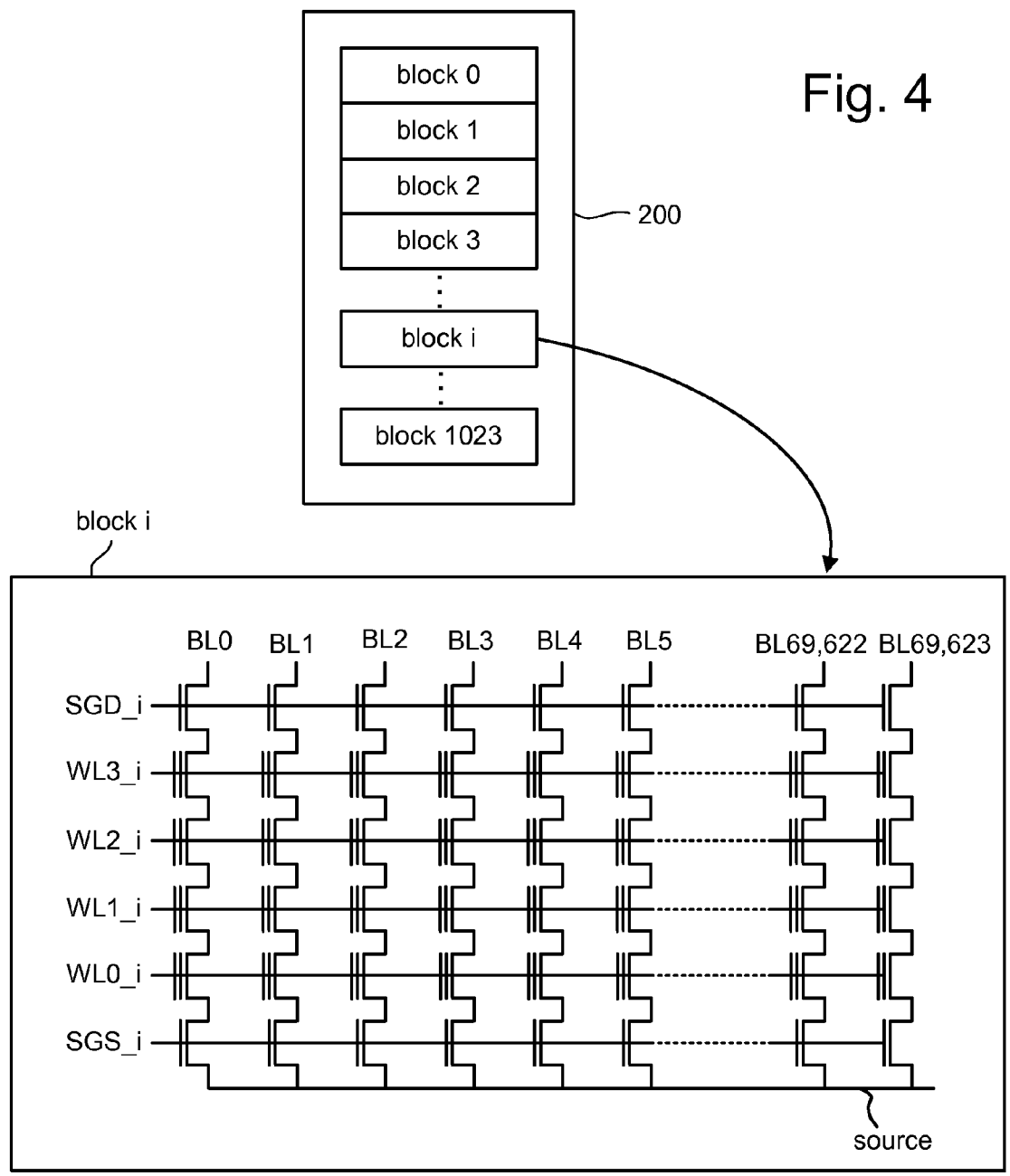
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
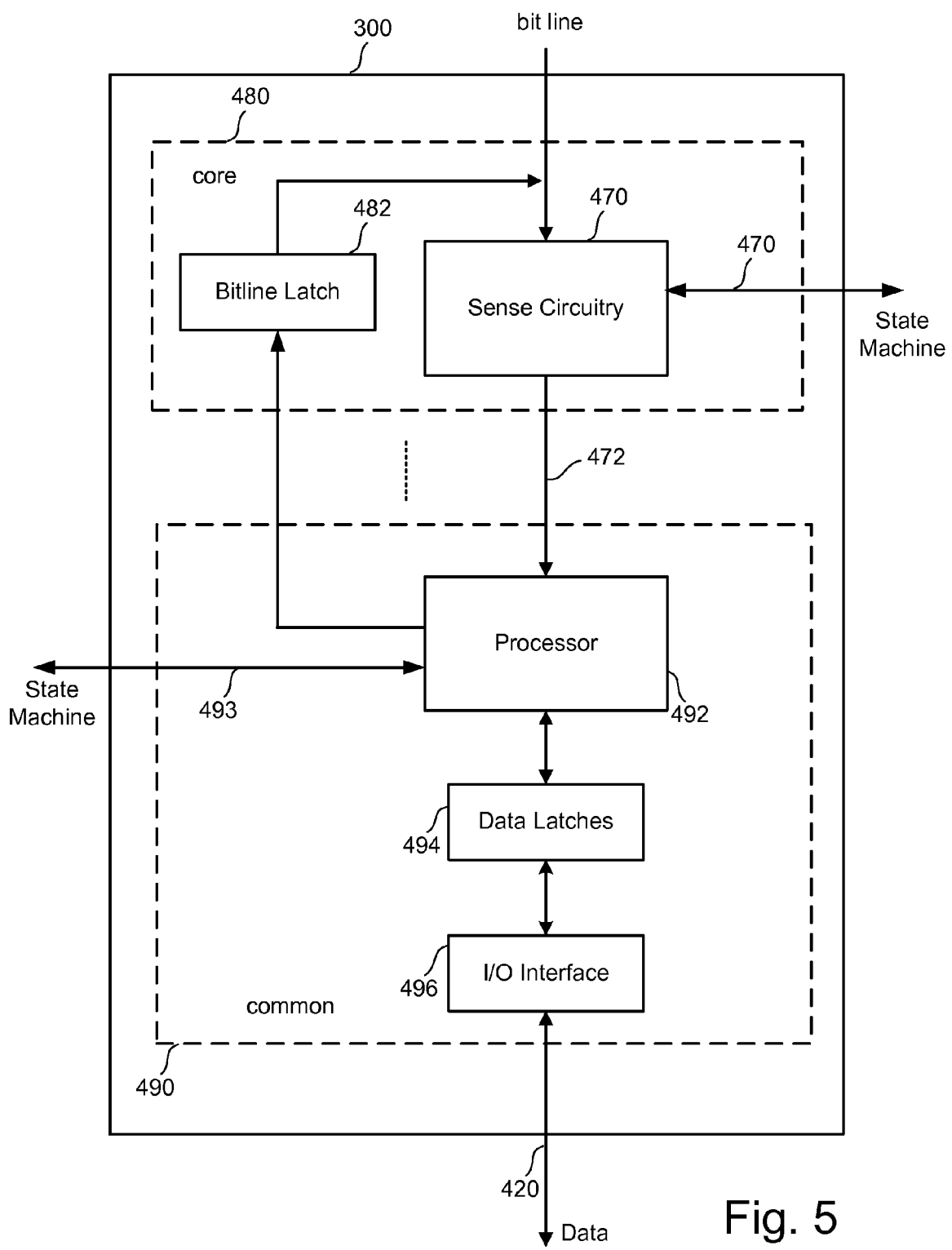
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
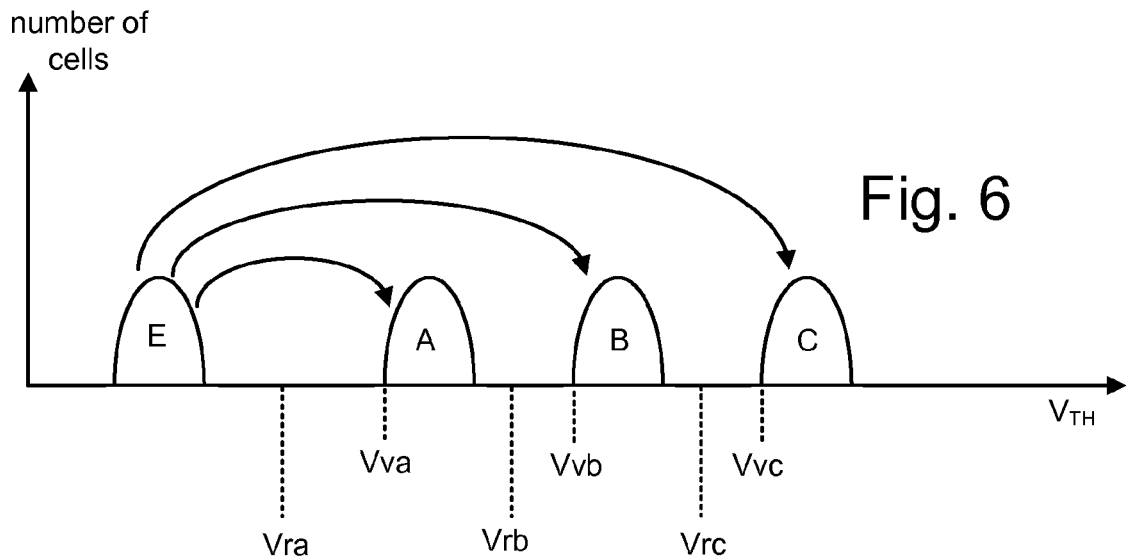
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell).

FIG. 6 shows a first threshold voltage distribution E for erased memory cells. Three threshold voltage distributions, A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
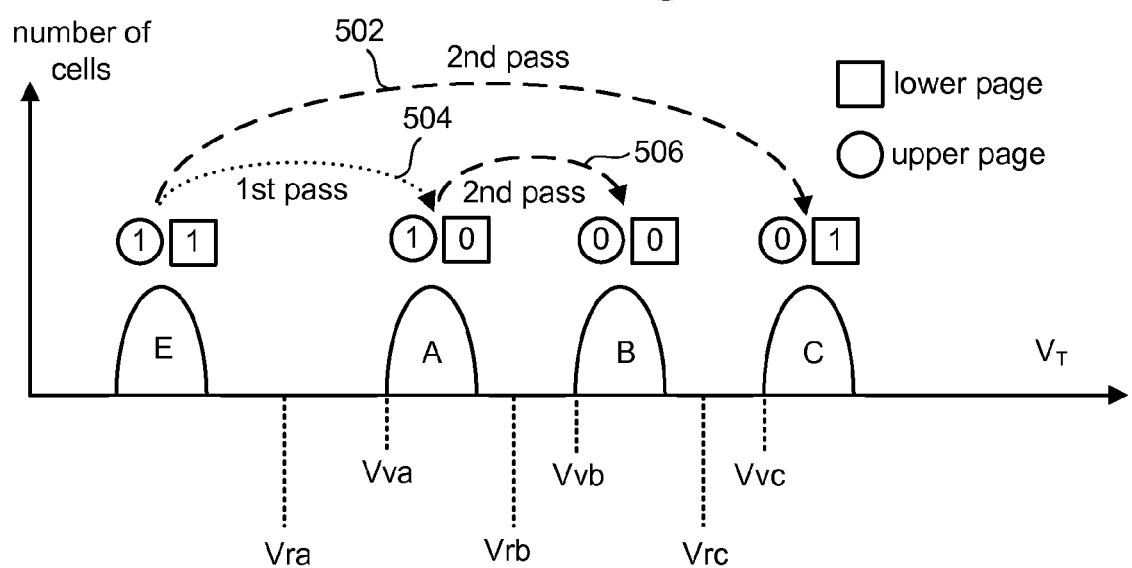
FIG. 7 depicts an example set of threshold voltage distributions and depicts an example programming process.

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

FIGS. 8A-C describe another multi-stage programming process for programming non-volatile memory. The process of FIG. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0. The programming process of FIGS. 8A-C is a two-stage programming process; however, the process of FIGS. 8A-C can be used to implement a three stage process, a four state process, etc. In the first stage, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state B. If the memory cell is in intermediate threshold voltage distribution 520 and the upper page data is to become data 0, then the threshold voltage of the memory cell will be raised so that the memory cell is in state C. The process depicted by FIGS. 8A-C reduces the effect of floating gate to floating gate coupling because only the upper page programming of neighbor memory cells will have an effect on the apparent threshold voltage of a given memory cell. An example of an alternate state coding is to move from distribution 520 to state C when the upper page data is a 1, and to move to state B when the upper page data is a 0.

Although FIGS. 8A-C provide an example with respect to four data states and two pages of data, the concepts taught by FIGS. 8A-C can be applied to other implementations with more or less than four states and different than two pages. More details about the programming process of FIG. 8A-C can be found in U.S. Pat. No. 7,196,928, incorporated herein by reference.

Figure 9A:
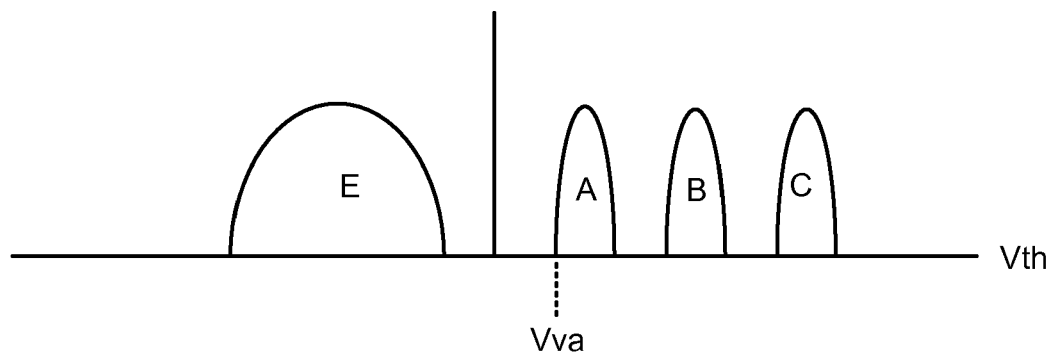
FIGS. 9A-9C depict examples of threshold voltage distributions and an example programming process.
Figure 9B:
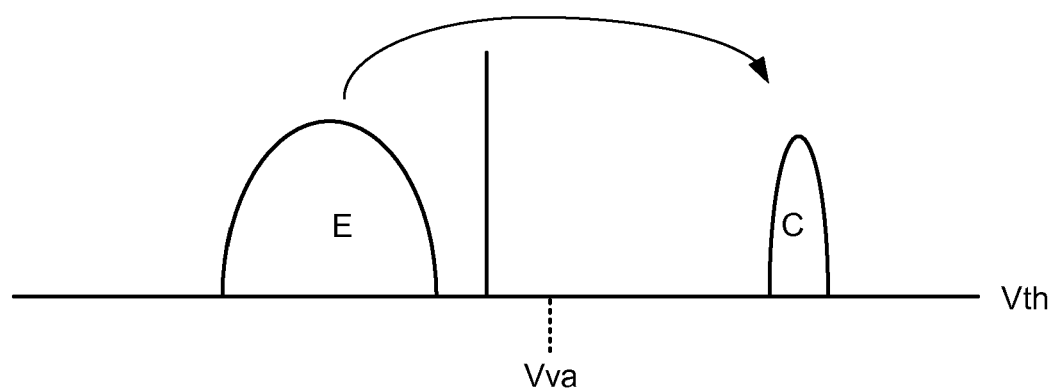
Figure 9C:
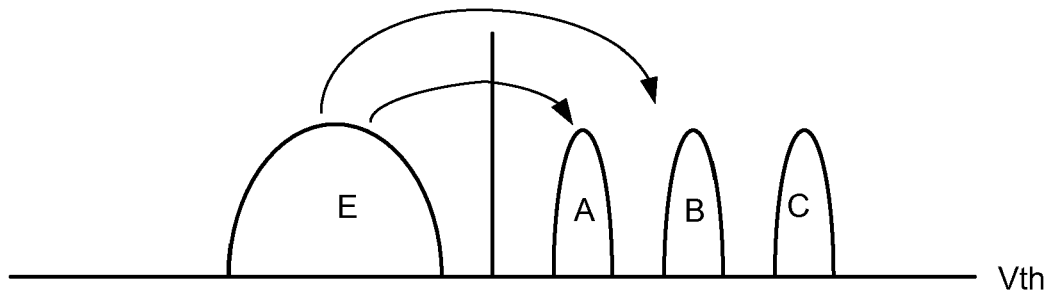
Figure 10A:
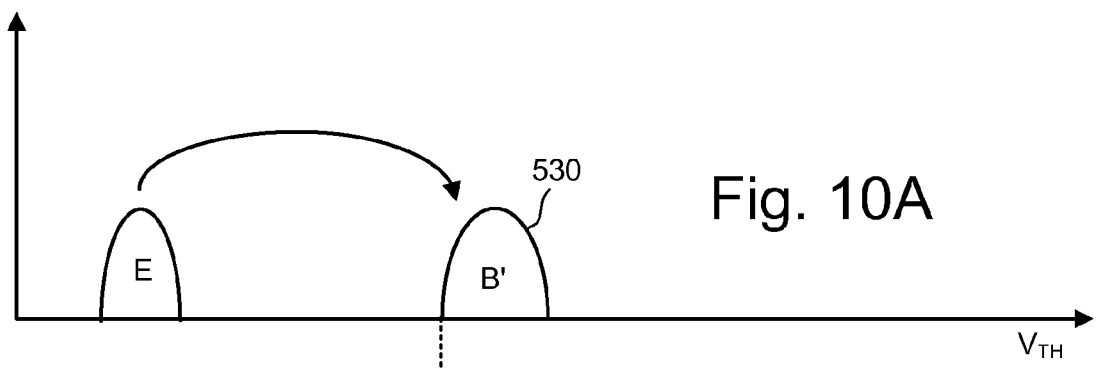
FIGS. 10A-10D depict examples of threshold voltage distributions and an example programming process.
Figure 10B:
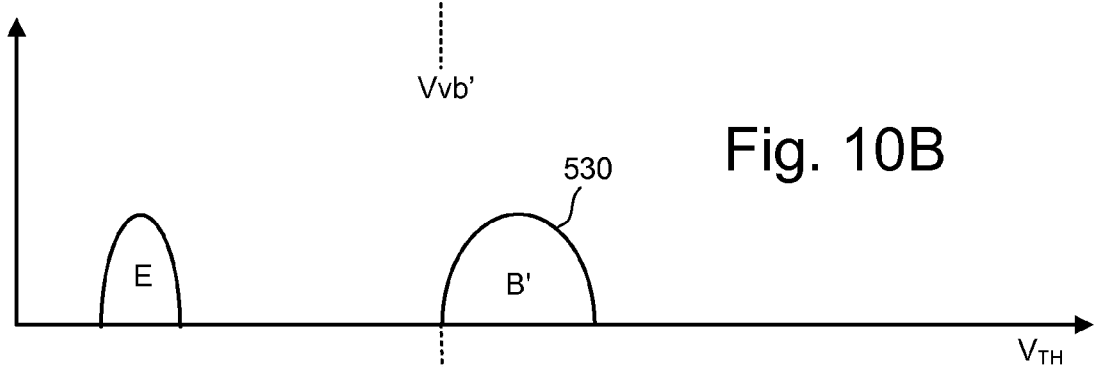
Figure 10C:
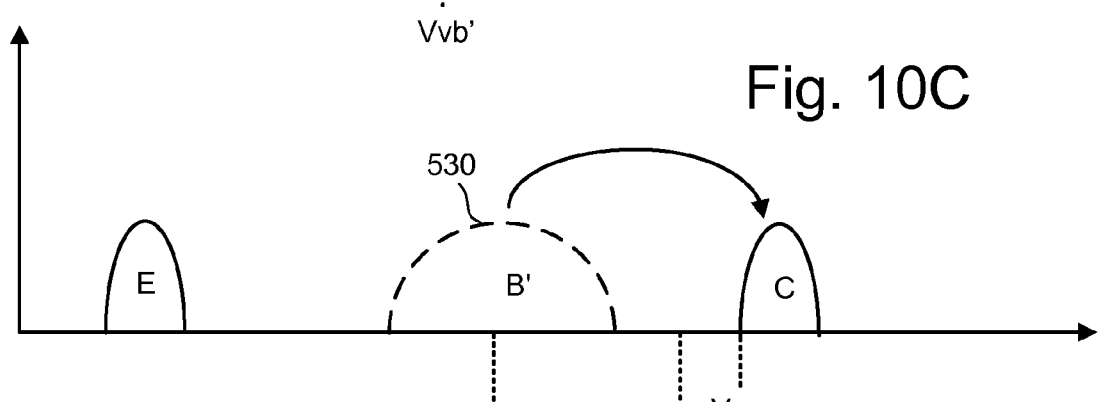
Figure 10D:
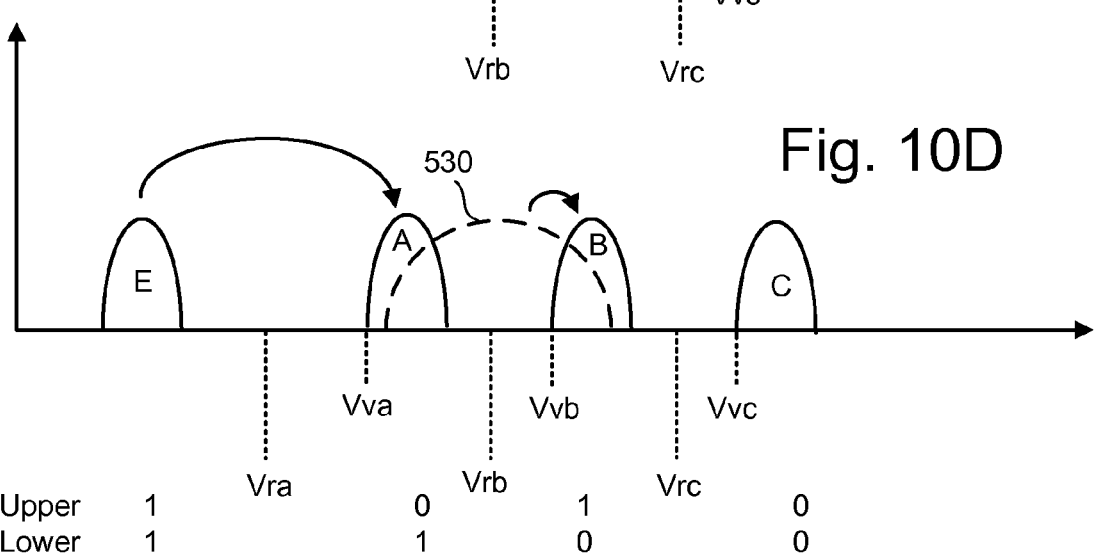

FIGS. 9A-C provide another example of a multi-stage programming process. FIG. 9A shows four threshold voltage distributions: E, A, B and C. Threshold voltage distribution E represents erased memory cells. Threshold voltage distributions A, B and C represent programmed memory cells. Initially, all memory cells are erased to threshold voltage distribution E. In a first programming stage, memory cells that are supposed to be programmed to threshold voltage distribution C are programmed to threshold voltage distribution C. The first programming stage is illustrated by FIG. 9B. In the second programming stage, those memory cells that are to be programmed into threshold voltage distributions A and B are programmed to the appropriate distribution, as represented by FIG. 9C.

In some embodiments of the processes of FIGS. 9A-C, after the first stage is performed for a first set of memory cells and prior to the second stage being performed for the first set of memory cells, the first stage is performed for a second set of memory cells. In one implementation, the first set of memory cells are connected to a first word line and the second set of memory cells are connected to a second word line.

FIGS. 10A-D describe another multi-state programming process that programs memory cells connected to a common word line and can be used in a similar manner to the process of FIGS. 9A-C. The first stage of the process of FIGS. 10A-D includes first programming memory cells targeted for threshold voltage distributions B and C to an intermediate threshold voltage distribution B', as depicted by threshold voltage distribution 530 in FIG. 10A. This first stage is then performed on an adjacent word line, which causes the intermediate threshold voltage distribution to widen due to coupling from neighboring floating gates (see FIG. 10B). The second programming stage includes programming those memory cells that are targeted for threshold voltage distribution C from B' (see FIG. 10C). The third stage of the programming process includes programming memory cells from distribution E to distribution A and from B' to B (see FIG. 10D).

Figure 11A:
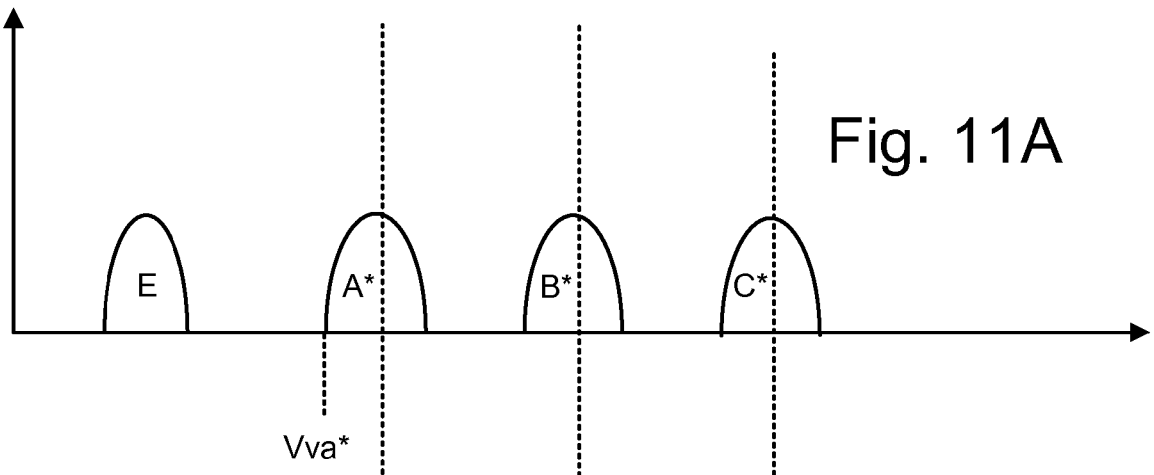
FIGS. 11A and 11B depict examples of threshold voltage distributions and an example programming process.
Figure 11B:
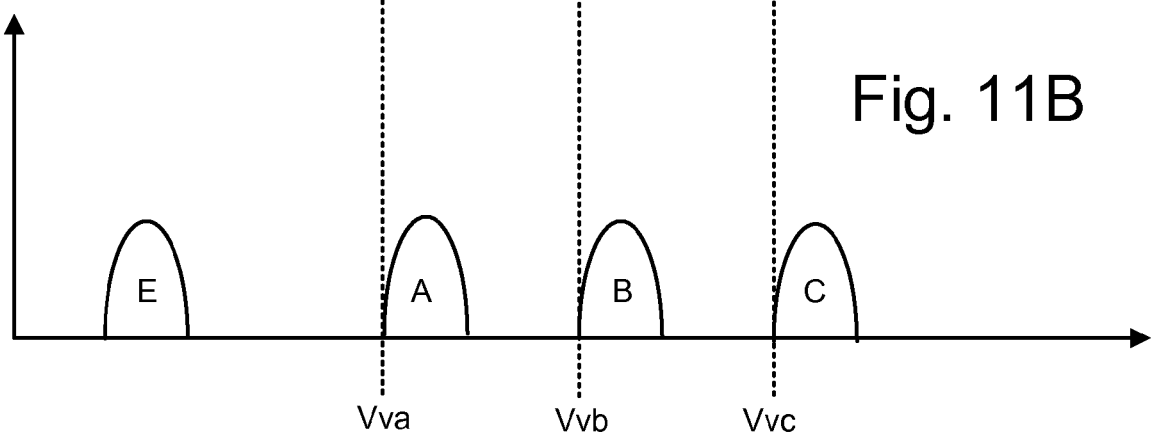

FIGS. 11A and 11B describe another two stage programming process. In the first stage, the memory cells are concurrently programmed in full sequence from the erased state E to the interim states A*, B* and C* (see FIG. 11A). In the second stage, memory cells in interim state A* are programmed to state A while memory cells in interim state B* are programmed to state B and memory cells in interim state C* are programmed to state C (See FIG. 11B). The verify points Vva, Vvb and Vvc for states A, B and C are higher than the verify points for interim states A*, B* and C*. Thus, during the first stage, a first set of memory cells are programmed to a lower threshold voltage than the final target threshold voltage. During the second stage, the first set of memory cells have their threshold voltages raised to the final target threshold voltage. In one embodiment, after the first stage for the first set of memory cells, and prior to the second stage for the first set of memory cells, the first stage is performed on a second set of memory cells that may be connected to the same word line as the first set of memory cells or a different word line than the first set of memory cells. In one example, the first stage is a coarse stage and the second stage is a fine stage, thus, interim states A*, B* and C* may be wider than final target states A, B and C.

Figure 12A:
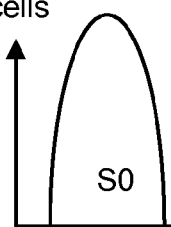
FIGS. 12A-12D depict examples of threshold voltage distributions and an example programming process.
Figure 12B:
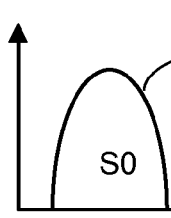
Figure 12C:
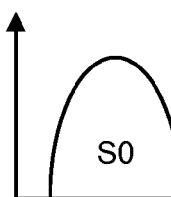
Figure 12D:
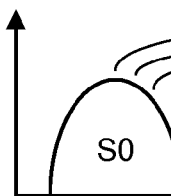

FIGS. 12A-D disclose a three-stage process for programming non-volatile memory. The process of FIG. 12A-D is performed for non-volatile memory cells that store three bits of data per memory cell. Before programming, all of the memory cells are erased to state S0 (FIG. 12A). FIG. 12B shows the first stage, which includes programming to state S4' those memory cells that are to be finally programmed to S4-S7. FIG. 12C shows the second stage, which includes programming from state S4' to states S4-S7. In one embodiment, S4' is wider in FIG. 2C because of coupling from memory cells on a neighboring word line that were partially or fully programmed between the first and second stages. FIG. 12D shows the third stage, which includes programming from state S0 to states S1, S2 and S3. When programming a first set of memory cells according to the process of FIGS. 12A-D, between any of the stages for a first set of memory cells, other memory cells (connected to the same word line as the first set of memory cells or connected to one or more different word lines) can be fully or partially programmed.

FIGS. 13A-D show a three-stage programming process for programming memory cells that store four bits of data per memory cell. Thus, the final set of memory cells can be divided into 16 threshold voltage distributions. During the first stage (FIG. 13A to FIG. 13B) of the three-stage programming process, memory cells are programmed into one of four intermediate threshold voltage distributions: E2, A2, B2 and C2. From those four intermediate threshold voltage distributions, the memory cells are then programmed into 16 distributions O-F during the second stage (FIG. 13B to FIG. 13C). In the third stage (FIG. 13C to FIG. 13D), each of the 16 distributions O-F are tightened. When programming a first set of memory cells according to the process of FIGS. 13A-D, between any of the stages for a first set of memory cells, other memory cells (connected to the same word line as the first set of memory cells or connected to one or more different word lines) can be fully or partially programmed.

Figure 14:
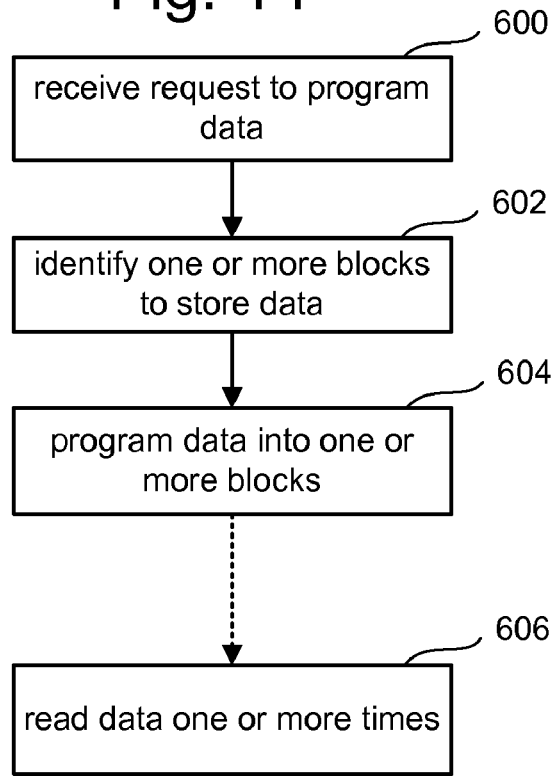
FIG. 14 is a flow chart describing one embodiment of a process for operating non-volatile storage.

FIG. 14 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other device will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

Figure 15:
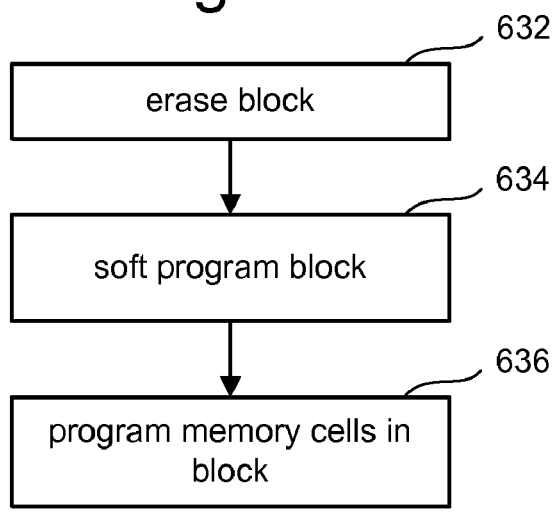
FIG. 15 is a flow chart describing one embodiment of a process for programming non-volatile storage.

FIG. 15 is a flow chart describing a programming process for programming memory cells in a block. FIG. 15 is one embodiment of step 604 of FIG. 14. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. Other techniques for erasing can also be used. In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. The process of FIG. 15 can be performed at the direction of the state machine, controller or combination of state machine and controller, using the various circuits described above. For example, the controller may issue commands and data to the state machine to program the data. In response, the state machine may operate the circuits described above to carry out the programming operations.

Figure 16:
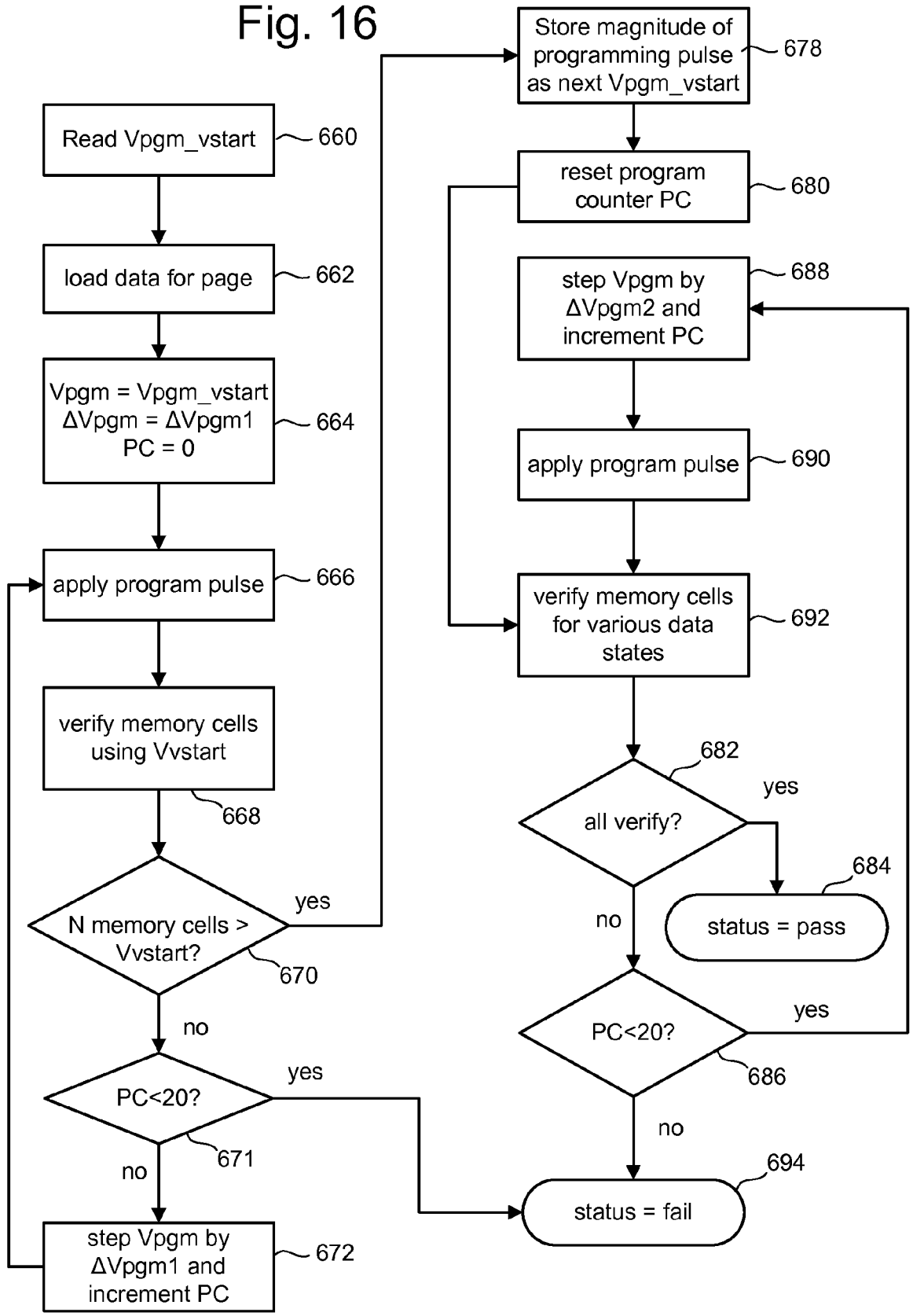
FIG. 16 is a flow chart describing one embodiment of a process for programming non-volatile storage.

FIG. 16 is a flow chart describing one embodiment of a process for programming memory cells connected to a common word line. FIG. 16 is performed during step 636 of FIG. 15. In one embodiment, the process of FIG. 16 is used to program all memory cells connected to a common word line. In other embodiments, the process of FIG. 16 is used to program a subset of memory cells connected to a common word line. For blocks of memory that include multiple word lines, therefore, step 636 of FIG. 15 includes performing the process of FIG. 16 one or more times for each word line to program the memory cells in a block.

In one example, memory cells are programmed according to an order that comprises programming the memory cells connected to WL0, followed by programming the memory cells connected to WL1, followed by programming the memory cells connected to WL2, etc. Other orders can also be used.

In other embodiments, a first set of memory cells connected to a first word line can be subjected to a subset of stages of a multi-stage programming process, followed by a second set of memory cells connected to a second word line being subjected to a subset of stages of the multi-stage programming process, followed by the first set of memory cells connected to the first word line can be subjected to one or more additional of stages of the multi-stage programming process, and so on. In such an embodiment, the process of FIG. 16 is performed once per set of memory cells for each stage of the multi-stage programming process during step 636 of FIG. 15.

Figure 17:
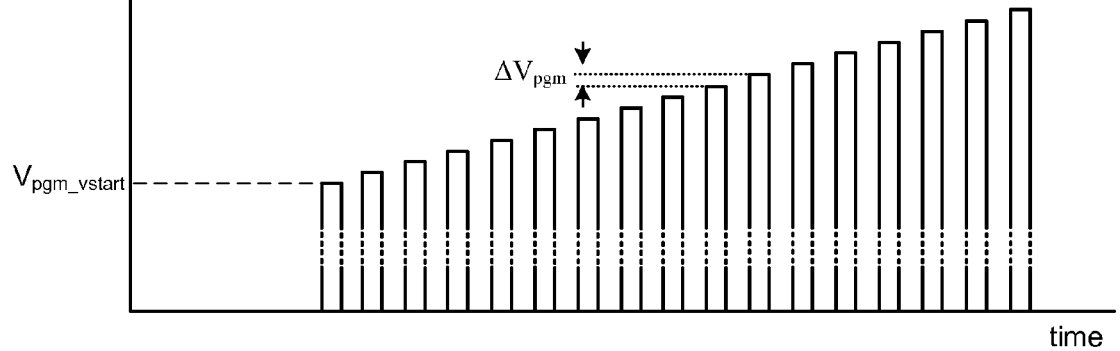
FIG. 17 depicts an example set of programming pulses.

In step 660 of FIG. 16, the system will read a stored identification of a magnitude for an initial programming pulse (hereinafter referred to as "Vpgm_vstart"), which can be based on previous programming or a default value. As discussed above, the programming process includes applying a set of programming pulses which increase the magnitude of each pulse. For example, FIG. 17 shows an example of a program voltage that includes a set of programming pulses having a magnitude for an initial programming pulse designated by Vpgm_vstart and a step size, representing the increment between pulses, designated by ΔVpgm. The magnitude of the first pulse Vpgm_vstart is read in step 660. In one embodiment, the magnitude will be determined from one or more previous programming processes. If this is the first time that programming is being performed, a default value for Vpgm_vstart can be read from a register. The magnitude of the initial programming pulse, Vpgm_vstart, can also be stored in the flash memory array, ROM, or somewhere else.

Figure 18:
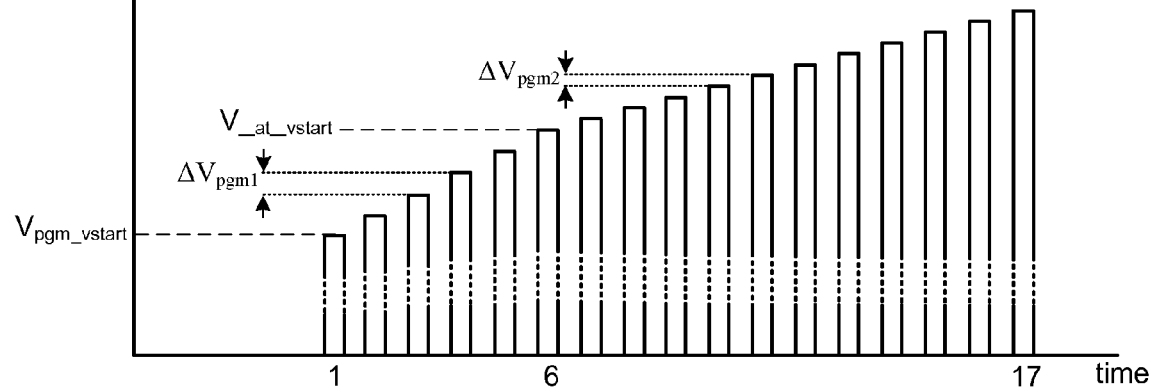
FIG. 18 depicts an example set of programming pulses.

The process of FIG. 16 uses two different step sizes: ΔVpgm1 and ΔVpgm2. In one embodiment, ΔVpgm1 is larger than ΔVpgm2. In this manner, the programming process of FIG. 16 starts out with the larger step size ΔVpgm1 so that programming is performed faster. When a predetermined number of memory cells reached an intermediate result or condition for the respective performance of the process of FIG. 16, then the process switches to the smaller step size for the remainder of the process of FIG. 16 in order to more accurately continue programming the memory cells to the target conditions for the particular performance of the process of FIG. 16. For example, FIG. 18 shows a program voltage that includes a set of programming pulses that have a magnitude of the initial programming pulse, Vpgm_vstart, and initially have a step size of ΔVpgm1. After the $6^{th}$ pulse, the step size changes to ΔVpgm2. In one embodiment, as described below, the pulse at which the step size changes is not determined in advance. The value of the programming pulse at which a predetermined number of memory cells reach an intermediate condition, thereby causing the step size to change, is used to refine the magnitude of the initial programming pulse, Vpgm_vstart, for future programming. That is current behavior of the memory cells (e.g., when the predetermined number of memory cells reached the intermediate condition) is used to set the magnitude of the initial programming pulse to increase the speed of the programming process without causing over-programming. In one embodiment, ΔVpgm1 is equal to ΔVpgm2.

Looking back at FIG. 16, in step 662, data is loaded for that particular page or word line. In step 664, the magnitude of the first program pulse is set to the value for Vpgm_vstart read in step 660. Additionally, the program step size ΔVpgm is set to ΔVpgm1, and the program counter PC is initialized as zero. In step 666, the first program pulse is applied. As discussed above, in one embodiment, the memory cells being programmed by the process of FIG. 16 are connected to a common word line and, thus, receive the same programming pulses at their respective control gates. After the program pulse, the memory cells are then verified against a voltage Vvstart in step 668. The voltage value Vvstart is chosen by device characterization so that any cells that pass Vvstart after one (or a different number) programming pulse are considered fast memory cells. The threshold voltage level of Vvstart is one example of the intermediate condition referenced above. If less than N memory cells being programmed have a threshold voltage greater than Vvstart (step 670), then in step 671 it is determined whether the program counter is less than 20 (or another suitable value). If the program counter is not less than 20, the there have been too many iterations and the programming process has failed. If the program counter is less than 20 (or another suitable value) then in step 672 the program voltage is incremented by ΔVpgm1 and the program counter PC is incremented by 1. Note that in some embodiments it maybe preferred to increase the program counter with a different value than 1 in order to reflect the larger step size. For example, the loop counter could be increased by a value of 2 in case the larger step size is two times larger than the smaller step size. After step 672, the process loops back to step 666 and the next program pulse is applied. Step 666-672 will be iterated until at least N memory cells have a threshold voltage greater than Vvstart. In one embodiment, the value of N can be 15 memory cells. In other embodiments, N can be less than 15 (e.g., 1 or another number) or greater than 15. In some implementations, device characterization or other simulation can be used to determine an appropriate value for N. However, the value of N should be a number less than all of the memory cells that are being programmed.

When, in step 670, it is determined that N or more memory cells have a threshold voltage greater than Vvstart, then the process continues as step 678, at which the magnitude of the programming pulse just applied is stored in a register, a flash memory location, or elsewhere, to be used as the magnitude or to determine the magnitude of the initial programming pulse, Vpgm_vstart, for future programming. In one embodiment, the magnitude of the programming pulse just applied is used as the magnitude of the initial programming pulse, Vpgm_vstart, for future programming. In another embodiment, an offset (positive offset or negative offset) is added to the magnitude of the programming pulse just applied to determine the magnitude of the initial programming pulse, Vpgm_vstart, for future programming. In some embodiment, the magnitude of the programming pulse just applied is stored in step 678 and the offset is applied later. In other embodiments, the offset is used on the magnitude of the programming pulse just applied and the result is stored in step 678. In other embodiments, the value used for the initial programming pulse, Vpgm_vstart, for future programming is based on a mathematical function of the magnitude of the programming pulse just applied or the sequence number of the program pulse just applied. All of these embodiments discussed above use some identification of the programming pulse just applied to determine the magnitude of the initial programming pulse, Vpgm_vstart, for future programming. Looking at FIG. 17, if after the $6^{th}$ programming pulse it is determined that N memory cells have a threshold voltage greater than Vvstart, then the magnitude of the 6th programming pulse (V_at_vstart), or some other related indication of the pulse, is stored, with or without an offset, in step 678.

In step 680, the program counter PC is reset to 0 and the process continues with step 692, at which time all of the memory cells are verified against the various target verify levels for the different program states. If all of the memory cells are verified to have reached their intended target level (step 682), then the process is complete and status is set to pass (step 684). In some embodiments, the programming process can complete successfully if less than all memory cells reach their intended target. For example, in some embodiments if almost all memory cells reach their intended target (e.g., with no more than a predetermined number of cells not reaching their target), the process is successful. Memory cells that have not reached their target can be corrected during a read operation using error correction or the data can be programmed elsewhere in the memory array in case too many cells have failed to reach their target.

If not all of the memory cells verify (which is likely the first time step 692 is performed), then those memory cells that have reached their respective target threshold voltages are locked out from further programming. In one embodiment, a memory cell is locked out from further programming by applying a sufficiently large bit line voltage (e.g., Vdd), as is known in the art.

In one embodiment, Vvstart is set low enough so that when step 670 passes because more than N memory cells have reached Vvstart and the processes continues from step 670 to step 678, none of the memory cells will have reached their target levels until at least one more additional program pulse is applied. In this manner, the program step size $\Delta Vpgm$ is changed from $\Delta Vpgm1$ to $\Delta Vpgm2$ before any memory cells are locked out from programming.

If not all of the memory cells verify, then it is determined in step 686 whether the program counter is less than 20 (or another suitable value). If the program counter is at 20 (or any other suitable value) or greater, then too many steps have been performed and the process fails (step 694). If the program counter is still less than 20 (or another other suitable value), then the program voltage is stepped by $\Delta Vpgm2$ and the program counter is incremented by one in step 688. In step 690, another program pulse is applied and the process continues at step 692 with the memory cells being verified. In some embodiments, the program counter maybe incremented in step 688 with a value different from one to take into account the difference in step sizes. Note that $\Delta Vpgm2$ is a smaller step size than $\Delta Vpgm1$. Thus, the program voltage Vpgm increases much faster during the iterations of step 666-672, as compared to the slower rising of the program voltage Vpgm during the iterations of step 690-688.

In one embodiment, the program counter is not reset at step 680. In such an embodiment, the test at step 680 may be changed to determine whether the program counter is less than a number higher than 20.

In one example, the process of FIG. 16 is used with the full sequence programming scheme of FIG. 6. In this embodiment, Vva can be used as Vvstart or a value below Vva can be used as Vvstart.

There are multi-stage program processes operating on a first set of memory cells in a manner such that a second set of memory cells can receive some programming between stages of the multi-stage program processes operating on the first set of memory cells. However, in one embodiment, once the process of FIG. 16 starts for a group of memory cells, no other memory cells receive programming until the process of FIG. 16 has completed.

During the verify operations of step 692 and read operations of step 606, the selected word line is connected to a voltage, a level of which is specified for each read operation (e.g., see read compare levels Vra, Vrb, and Vrc, of FIG. 6) or verify operation (e.g. see verify levels Vva, Vvb, and Vvc of FIG. 6) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

FIGS. 19-26 are flow charts describing various embodiments for implementing step 636 of FIG. 15, programming memory cells, using the process of FIG. 16.

Figure 19:
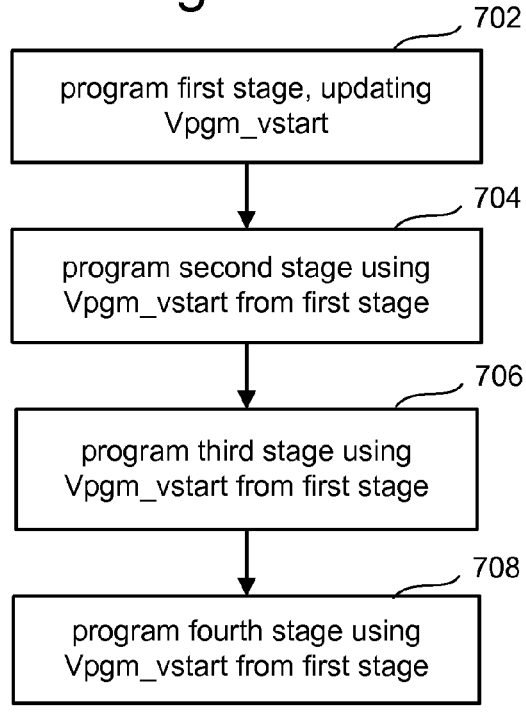

FIG. 19 describes an embodiment for implementing a multi-stage programming process (or multiple programming processes), including any of the multi-stage programming processes described above. In the embodiment of FIG. 19, Vpgm_vstart is updated during the first stage of multi-stage programming process, and future stages of the same multi-stage programming process use the Vpgm_vstart from the first stage. In step 702, the first stage of the multi-stage programming process is performed, including performing according to the process of FIG. 16. As described above, performing the process of FIG. 16 will include updating the value of Vpgm_vstart at step 678 of FIG. 16. In step 704, the second stage of the multi-stage programming process is performed, including performing the process of FIG. 16 with the value used for the magnitude of the initial programming pulse, Vpgm_vstart, being (or being based on) the value updated and stored in step 702. When performing step 704, the process of FIG. 16 is modified to skip step 678 so that if greater than N memory cells have a threshold voltage greater than Vvstart, then the process proceeds from step 670 to step 692 (or, in some embodiments, step 680). In this manner, Vpgm_start is not updated during the performance of step 704.

In step 706, the third stage of the multi-stage programming process is performed, including performing the process of FIG. 16 with the value used for the magnitude of the initial programming pulse, Vpgm_vstart, being (or being based on) the value updated and stored in step 702. When performing step 706, the process of FIG. 16 is modified to skip step 678 so that if greater than N memory cells have a threshold voltage greater than Vvstart, then the process proceeds from step 670 to step 692 (or, in some embodiments, step 680). In this manner, Vpgm_vstart is not updated during the performance of step 706.

In step 708, the fourth stage of the multi-stage programming process is performed, including performing the process of FIG. 16 with the value used for the magnitude of the initial programming pulse, Vpgm_vstart, being (or being based on) the value updated and stored in step 702. When performing step 706, the process of FIG. 16 is modified to skip step 678 so that if greater than N memory cells have a threshold voltage greater than Vvstart, then the process proceeds from step 670 to step 692 (or, in some embodiments, step 680). In this manner, Vpgm_vstart is not updated during the performance of step 708. The flow chart of FIG. 19 shows four stages in the multi-stage programming process. However, the process of FIG. 19 can be extended to more than four stages by adding extra steps like step 708. Alternatively, the process of FIG. 19 can be used with multi-stage programming processes with only three stages by only performing steps 702, 704 and 706. The process of FIG. 19 can be used with multi-stage programming processes with only two stages by only performing steps 702 and 704. Note that in some embodiments, the value of ΔVpgm2 can be changed for each stage of the multi-stage programming process. In other embodiments, each stage will use the same ΔVpgm2. Similarly, in some embodiments, the value of ΔVpgm1 can be changed for each stage of the multi-stage programming process. In other embodiments, each stage will use the same ΔVpgm2.

Figure 19A:
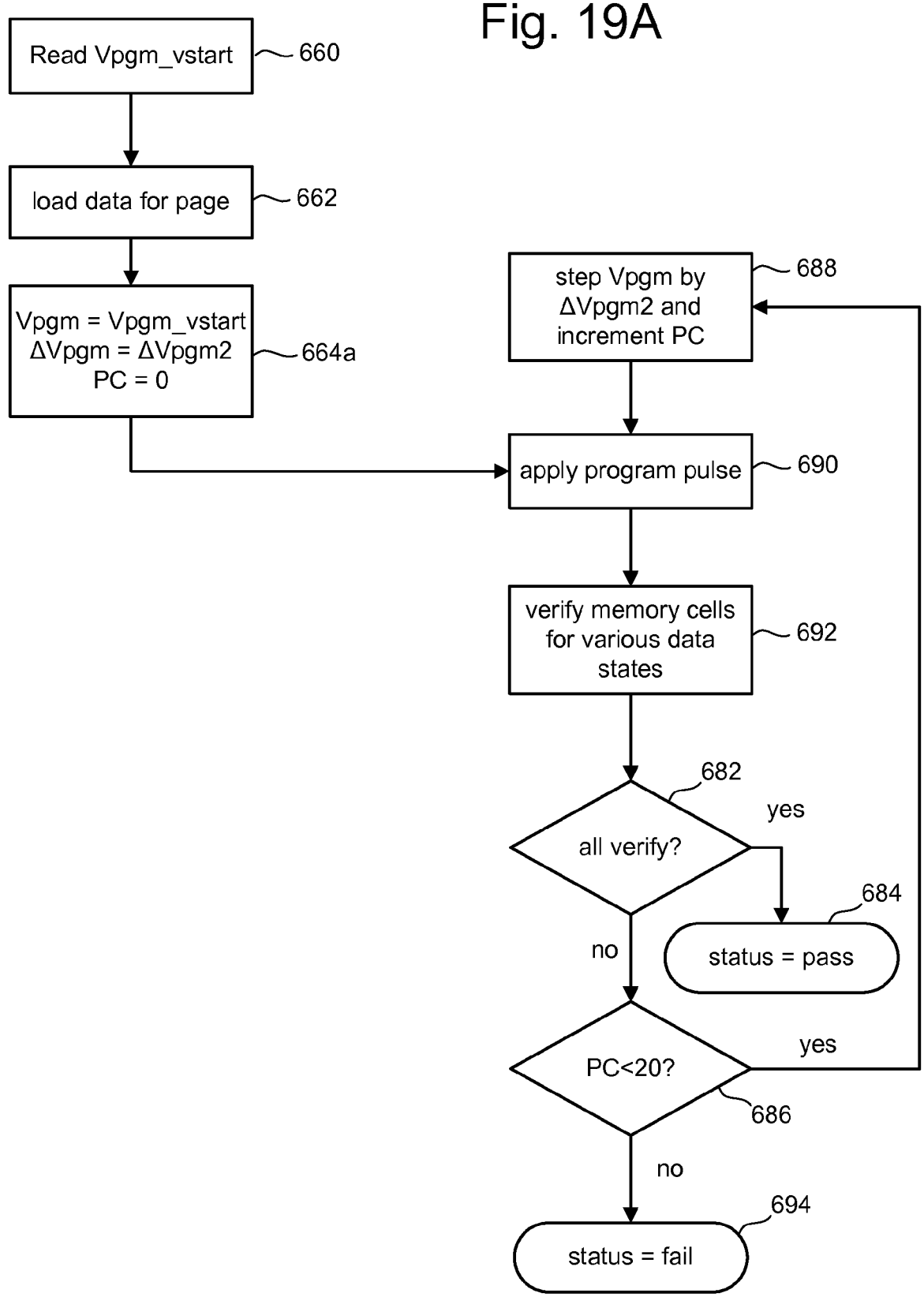

In another set of embodiments, steps 702 will include performing the process of FIG. 16 and storing a new value for Vpgm_vstart. However, steps 704, 706 and 708 will perform the process of FIG. 19A rather than the process of FIG. 16. FIG. 19A is similar to FIG. 16, except that steps 666, 668, 670, 671, 672, 678 and 680 are not performed. Steps 660 and 662 are the same as in FIG. 16. In step 664a, ΔVpgm is set to ΔVpgm2 and then the process continues at step 690 and a program pulse is applied. Steps 682, 684, 686, 688, 690, 692 and 694 are the same as in FIG. 16. With this embodiment, there is no time used for searching for the optimum Vpgm_vstart value since it has already been found. Note that in some embodiments, the value of ΔVpgm2 can be changed for each stage of the multi-stage programming process. In other embodiments, each stage will use the same ΔVpgm2.

In one example, the process of FIG. 19 is used with the programming scheme of FIG. 7. In this embodiment, Vra or another value below Vva can be used as Vvstart. When using the process of FIG. 19 is used with the programming scheme of FIG. 8, a value below Vvb' can be used as Vvstart. When using the process of FIG. 19 with the programming scheme of FIGS. 9A-C, Vva, a value below Vva or a value below Vvc can be used as Vvstart when programming data to the C state. When using the process of FIG. 19 is used with the programming scheme of FIGS. 10A-D, a value below Vvb' can be used as Vvstart when programming data to B'. When using the process of FIG. 19 is used with the programming scheme of FIGS. 11A-B, a value at or below Vva* can be used as Vvstart when programming data to A*, B* or C*. When the process of FIG. 19 is used with the programming scheme of FIGS. 12A-E, a value below Vvs4' can be used as Vvstart when programming data to S4'. When the process of FIG. 19 is used with the programming scheme of FIGS. 13A-D, a value at or below VvA2 can be used as Vvstart when programming data to A2, B2 and C2. Additionally, other values for Vvstart can also be used. These values of Vvstart can also be used with the other embodiments described below.

Figure 20:
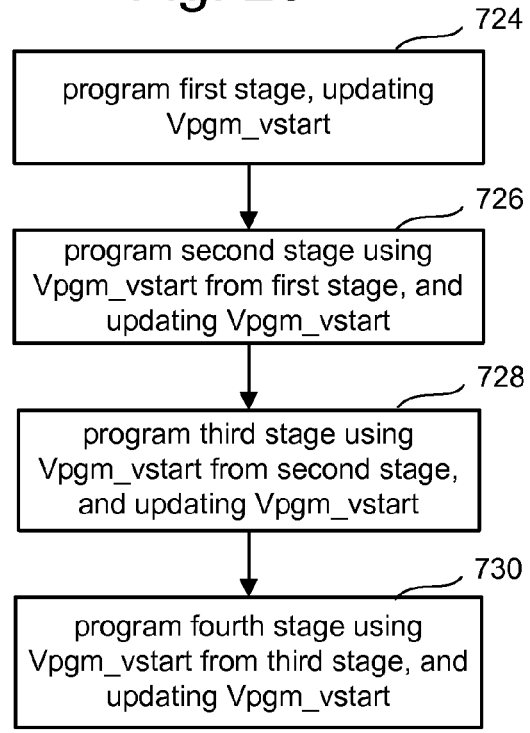

FIG. 20 describes another embodiment for implementing a multi-stage programming process (or multiple programming processes), including any of the multi-stage programming processes described above. In the embodiment of FIG. 20, Vpgm_vstart is updated during each stage of multi-stage programming process. In step 724, the first stage of the multi-stage programming process is performed, including performing the process of FIG. 16. As described above, performing the process of FIG. 16 will include updating the value of Vpgm_vstart at step 678 of FIG. 16. In step 726, the second stage of the multi-stage programming process is performed, including performing the process of FIG. 16 with the value used for Vpgm_vstart being (or being based on) the value updated and stored in step 724. Step 726 will include updating the value of Vpgm_vstart at step 678 of FIG. 16. In step 728, the third stage of the multi-stage programming process is performed, including performing the process of FIG. 16 with the value used for Vpgm_vstart being (or being based on) the value updated and stored in step 726. Step 728 will include updating the value of Vpgm_vstart at step 678 of FIG. 16. In step 730, the fourth stage of the multi-stage programming process is performed, including performing the process of FIG. 16 with the value used for Vpgm_vstart being (or being based on) the value updated and stored in step 728. Step 730 will include updating the value of Vpgm_vstart at step 678 of FIG. 16.

The flow chart of FIG. 20 shows four stages in the multi-stage programming process. However, the process of FIG. 20 can be extended to more than four stages by adding extra steps similar to step 730. Alternatively, the process of FIG. 20 can be used with multi-stage programming processes having only three stages by only performing steps 724, 726 and 728. The process of FIG. 20 can be used with multi-stage programming processes having only two stages by only performing steps 724 and 726.

Figure 21:
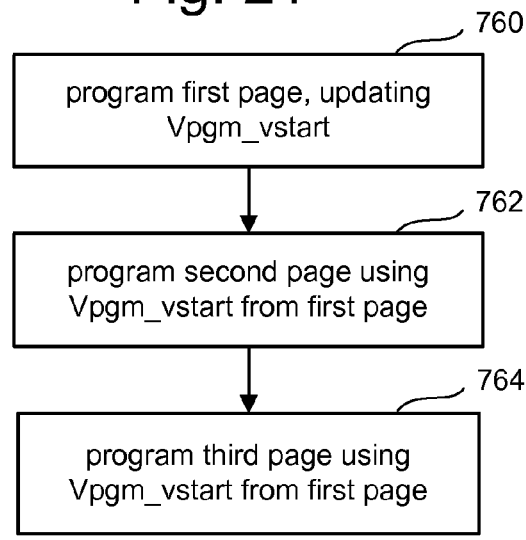

FIG. 21 describes another embodiment for implementing multiple programming processes. In the embodiment of FIG. 21, Vpgm_vstart is updated while programming the first page, and the programming of future pages use the Vpgm_vstart determined while programming the first page. In step 760, the first page of data is programmed using the process of FIG. 16, including the updating of the value of Vpgm_vstart at step 678 of FIG. 16. In step 762, the second page is programmed using the process of FIG. 16 with the value used for Vpgm_vstart being (or being based on) the value updated and stored in step 760. When performing step 762, the process of FIG. 16 is modified to skip step 678 so that if greater than N memory cells have a threshold voltage greater than Vvstart, then the process proceeds from step 670 to step 692. In this manner, Vpgm_start is not updated during the performance of step 762. In step 764, the third page is programmed using the process of FIG. 16 with the value used for Vpgm_vstart being (or being based on) the value updated and stored in step 760. When performing step 764, the process of FIG. 16 is modified to skip step 678 so that if greater than N memory cells have a threshold voltage greater than Vvstart, then the process proceeds from step 670 to step 692. In this manner, Vpgm_start is not updated during the performance of step 764. If more pages of data need to be programmed, the process continues with additional steps similar to step 764, but operating on the different page of data. If only two pages of data are being programmed, then only steps 760 and 762 need be performed. In another embodiment, steps 762, 764 and steps for additional pages will program based on the process of FIG. 19A (rather than the above-described modified version of FIG. 16), using the Vpgm_vstart from step 760.

Figure 22:
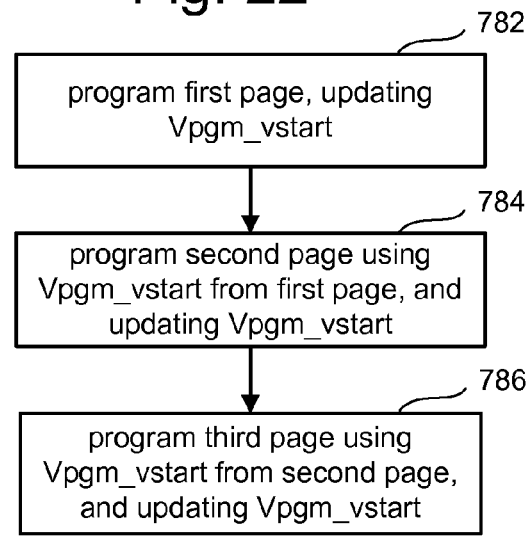

FIG. 22 describes another embodiment for implementing multiple programming processes. In the embodiment of FIG. 19, Vpgm_vstart is updated during the programming of each page of data. In step 782, the first page of data is programmed using the process of FIG. 16, including the updating of the value of Vpgm_vstart at step 678 of FIG. 16. In step 784, the second page of data is programmed, including performing the process of FIG. 16 with the value used for Vpgm_vstart being (or being based on) the value updated and stored in step 782. Step 784 will include updating the value of Vpgm_vstart at step 678 of FIG. 16. In step 786, the third page of data is programmed, including performing the process of FIG. 16 with the value used for Vpgm_vstart being (or being based on) the value updated and stored in step 784. Step 786 will include updating the value of Vpgm_vstart at step 678 of FIG. 16. If more pages of data need to be programmed, the process continues with additional steps similar to step 786, but operating on the different page of data. If only two pages of data are being programmed, then only steps 782 and 784 need be performed.

FIG. 23 describes an embodiment for implementing multiple programming process. In the embodiment of FIG. 23, Vpgm_vstart is updated while programming memory cells connected to a first word line, and the programming of memory cells on other word lines use the Vpgm_vstart determined while programming the memory cells connected to the first word line. In step 800, memory cells connected to the first word line are programmed using the process of FIG. 16, including the updating of the value of Vpgm_vstart at step 678 of FIG. 16. In step 802, memory cells connected to a second word line are programmed using the process of FIG. 19A or the process of FIG. 16, with the value used for Vpgm_vstart being (or being based on) the value updated and stored in step 800. When performing step 802 using the process of FIG. 16, the process of FIG. 16 is modified to skip step 678 so that if greater than N memory cells have a threshold voltage greater than Vvstart, then the process proceeds from step 670 to step 692. In this manner, Vpgm_start is not updated during the performance of step 802. In step 804, memory cells connected to a third word line are programmed using the process of FIG. 19A or the process of FIG. 16 with the value used for Vpgm_vstart being (or being based on) the value updated and stored in step 800. When performing step 804 using the process of FIG. 16, the process of FIG. 16 is modified to skip step 678 so that if greater than N memory cells have a threshold voltage greater than Vvstart, then the process proceeds from step 670 to step 692. In this manner, Vpgm_start is not updated during the performance of step 804. If more word lines need to be programmed, the process continues with additional steps similar to 804, but operating on the different word lines. If only two word lines are being programmed, then only steps 800 and 802 need be performed.

It is also possible in some embodiments that the initial programming pulse magnitude is determined separately for even and odd word lines. This scheme can be beneficial in cases that, due to manufacturing process variations, even and odd word lines have different programming characteristics.

FIG. 24 describes an embodiment for implementing multiple programming process. In the embodiment of FIG. 24, Vpgm_vstart is updated periodically. Between updates, the previously determined value for Vpgm_vstart is used. In step 820, memory cells are programmed using the process of FIG. 16, including the updating of the value of Vpgm_vstart at step 678 of FIG. 16. The next time that data needs to be programmed, the system determines whether the elapsed time since the most recently determined value of Vpgm_vstart was stored is greater than a predetermined period in step 822. If not, then the next programming process of step 824 uses the process of FIG. 16 without updating Vpgm_vstart. That is, the process of FIG. 16 is modified to skip step 678 so that if greater than N memory cells have a threshold voltage greater than Vvstart, then the process proceeds from step 670 to step 692. Alternatively, step 824 can be implemented by performing the process of FIG. 19A. If, in step 822, it is determined that the elapsed time since the most recently determined value of Vpgm_vstart was stored is greater than a predetermined period, then in step 826, the next programming process is performed using the method of FIG. 16, including updating the value of Vpgm_vstart at step 678 of FIG. 16.

FIG. 25 describes an embodiment for implementing multiple programming processes. In this embodiment, the value of Vpgm_vstart is updated while performing the process of FIG. 16 during trial programming. Trial programming is a programming process in which user data is not programmed. Rather, dummy data and/or dummy memory cells are programmed using the process of FIG. 16 and during that process Vpgm_vstart is updated. Subsequently, when programming user data, the process of FIG. 16 is used, with Vpgm_vstart being (or being based on) the value based on the trial programming and Vpgm_vstart not being updated while programming the user data. For example, in step 840, the trial programming (using the process of FIG. 16) is performed and Vpgm_vstart is updated. In step 842, user data is programmed using the process of FIG. 16 and the Vpgm_vstart based on the trial programming. Vpgm_vstart is not updated during step 842. That is, the process of FIG. 16 is modified to skip step 678 so that if greater than N memory cells have a threshold voltage greater than Vvstart, then the process proceeds from step 670 to step 692. In step 844, user data is programmed using the process of FIG. 16 and the Vpgm_vstart based on the trial programming. Vpgm_vstart is not updated during step 844. That is, the process of FIG. 16 is modified to skip step 678 so that if greater than N memory cells have a threshold voltage greater than Vvstart, then the process proceeds from step 670 to step 692. Additional steps of programming user data can also be performed, without updating Vpgm_vstart. In some embodiment, the process of FIG. 25 can stop after step 842. In alternative embodiments, steps 842 and 844 can be implemented by performing the process of FIG. 19A (including not updating Vpgm_vstart) rather than the above-described modification to the process of FIG. 16.

Note that the methods for performing multiple programming processes described herein can be used to perform multiple stages of one or more multi-stage programming processes.

FIG. 26 describes another embodiment for implementing a multi-stage programming process, including any of the multi-stage programming processes described above. In the embodiment of FIG. 26, Vpgm_vstart is updated during the second stage of the multi-stage programming process. In step 846, the first stage of the multi-stage programming processes is performed using the process of FIG. 16 without updating Vpgm_vstart. That is, the process of FIG. 16 is modified to skip step 678 so that if greater than N memory cells have a threshold voltage greater than Vvstart, then the process proceeds from step 670 to step 692. Alternatively, the process of FIG. 19A can be used. In step 848, the second stage of the multi-stage programming processes is performed using the process of FIG. 16, with updating of Vpgm_vstart. In step 850, the third stage of the multi-stage programming processes is performed using the process of FIG. 16, with the value used for Vpgm_vstart being (or being based on) the value stored in step 678 performed during step 848. In some embodiments, step 890 can include updating Vpgm_vstart, while in other embodiments Vpgm_vstart will not be updated in step 890. Additional steps like step 890 can be added to the process of FIG. 26.

In general, coarse/fine programming includes a two phased programming approach. The first phase is a coarse phase, where the emphasis is on programming quickly, with less need for precision. The second phase is the fine phase, where the emphasis is on programming with precision. In one embodiment, the coarse phase includes programming to one or more coarse verify levels and the fine phase includes programming to one or more fine verify levels, where the fine verify levels correspond to the target levels for programming.

FIGS. 11A and 11B (discussed above) provide one example of coarse/fine programming that uses two passes. During the first pass (FIG. 11A) the coarse phase is implemented. During the second pass (FIG. 11B), the second phase is implemented. FIGS. 27 and 28 include graphs that depict an embodiment of coarse/fine programming that uses only one pass, during which both the coarse phase and fine phase are performed.

FIGS. 27A, 27B, and 27C depict the behavior of a fast memory cell which has a threshold voltage that passes both the course and target verify levels in the same pulse so that the memory cell does not enter the fine mode. FIGS. 28A, 28B, and 28C depict a slower memory cell that participates in both the coarse and fine modes. FIGS. 27A and 28A depict programming pulses Vpgm applied to the control gates of the memory cells being programmed. Note that FIGS. 27A and 28A show the programming pulses adjacent each to each other to make the graph easier to read. However, there are actually time spaces between the pulse to allow for the verify operations. FIGS. 27B and 28B depict bit line voltages Vbl for the memory cells being programmed. FIGS. 27C and 28C depict the threshold voltages for the memory cells being programmed.

With respect to FIGS. 27A, 27B, and 27C a fast memory cell is depicted. In response to a first pulse that starts at time t0, the memory cell's threshold voltage is raised above Vver3. In one embodiment, the verify level Vver3 corresponds to Vvstart of FIG. 16. In between t1 and t2, the threshold voltage of the memory cell rises above both Vver2 (coarse verify level) and Vver1 (fine verify level). At t2, the bit line voltage will be raised to Vinhibit in order to inhibit (e.g., lockout) any further programming. Note that in one embodiment, Vver3 may be 0.2v to 0.3v lower than the Vver 2 for the lowest programmed state.

Figure 29:
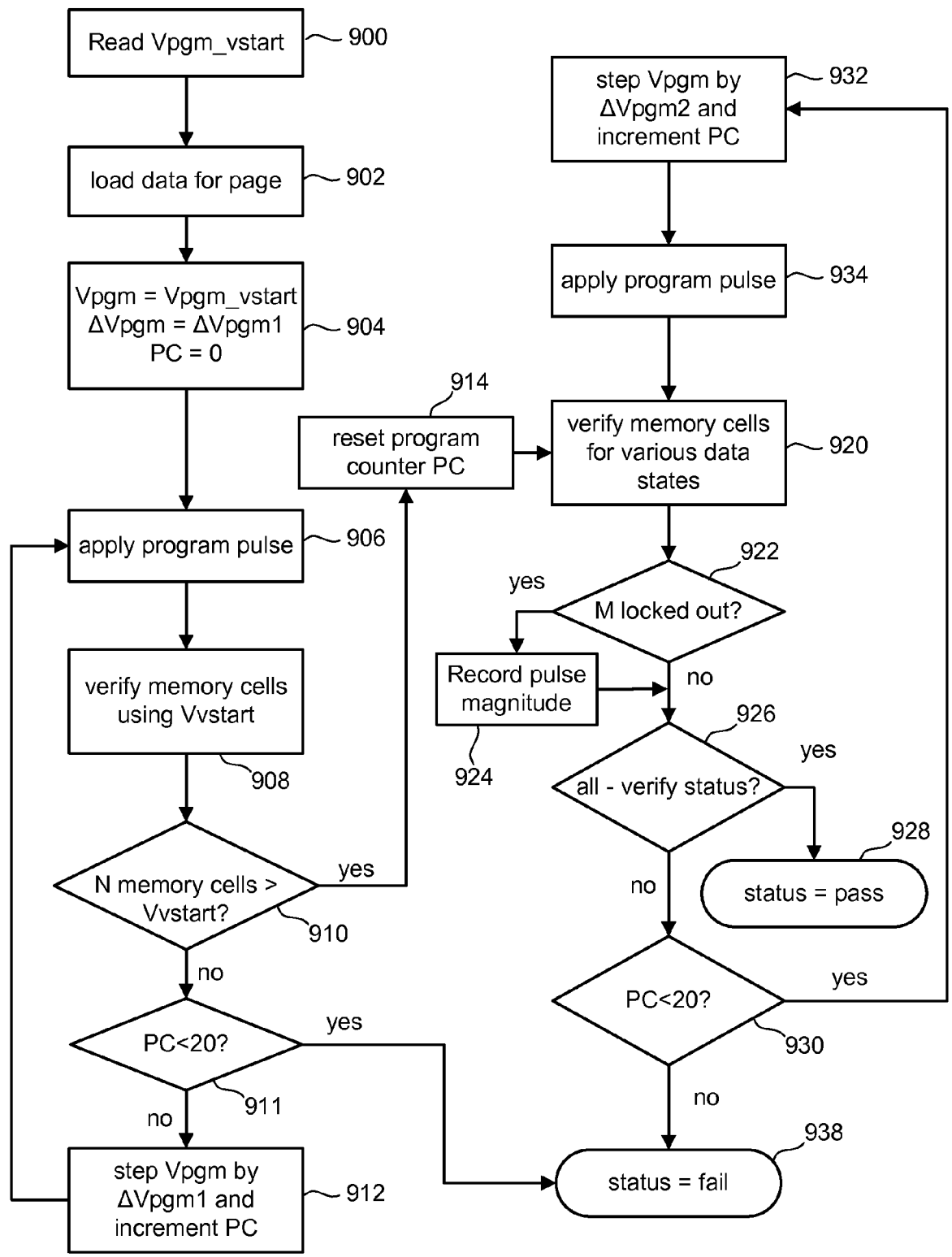
FIG. 29 is a flow chart describing one embodiment of a process for programming non-volatile storage.

With respect to the slower memory cell of FIGS. 28A-C, the threshold voltage of the memory cell will not rise above Vver3 until the period between t2 and t3. Thus, programming pulses will increment by ΔVpgm1 prior to t3. If the threshold voltage in more than N memory cells in the page is greater than Vver3 at t3, then the pulse increment value is changed at t3 to ΔVpgm2, and subsequent pulses increase in magnitude by ΔVpgm2. The threshold voltage in the memory cell increases above Vver2 between t3 and t4, therefore, the memory cell enters the fine programming phase and the bit line is raised to Vs (e.g., ~0.2-0.5v, or another suitable level) at t4. In between t4 and t5, the threshold voltage increase is slowed down due to the increase in bit line voltage and due to the decrease in the Vpgm increment value. However, the threshold voltage does become greater than Vver1 between t4 and t5; therefore, the threshold voltage has reached its target level and the bit line voltage is raised to Vinhibit in order to inhibit further programming at t5. The coarse/fine programming technique can be used in conjunction with the various programming processes discussed above. FIG. 29 provides another embodiment for programming. FIG. 29 depicts an alternative embodiment of the process of FIG. 16 that includes steps 922 and 924 for determining a future value of Vpgm_vstart later in the process, and with more precision. Steps 900-912 of FIG. 29 are the same as steps 660-672 of FIG. 16. Steps 926, 928, 930, 938, 932 and 934 of FIG. 29 are the same as steps 682, 684, 686, 694, 688 and 690 of FIG. 16. If, in step 910 of FIG. 29, it is determined that N or more memory cells have a threshold voltage greater Vvstart, then the process of FIG. 29 proceeds from step 910 to step 914 and resets the program counter PC to zero. After step 914, the process proceeds to step 920. Step 920 of FIG. 29 is the same as step 692 of FIG. 16. After verifying memory cells in step 920, step 922 includes determining whether at least M memory cells have reached their target threshold voltage level and have been locked out from additional programming. In one example, M could be equal to 15 memory cells. In other embodiments, more or less than 15 can be used. If at least M memory cells have not reached their target threshold voltage level and have been locked out from additional programming, the process continues to step 926. However, if M memory cells have been locked out, then the pulse magnitude for the most recently applied pulse is recorded and the process continues to step 926. Note that the system only records the magnitude (or other data) at the first time it is determined that M memory cells have reached their target threshold voltage level and have been locked out from additional programming.

One embodiment of step 924 includes storing the magnitude of the programming pulse just applied in a register, a flash memory location, or elsewhere, to be used as the magnitude or to determine the magnitude of the initial programming pulse, Vpgm_vstart, for future programming. In one embodiment, the magnitude of the programming pulse just applied is used as the magnitude of the initial programming pulse, Vpgm_vstart, for future programming. In another embodiment, an offset (positive offset or negative offset) is added to the magnitude of the programming pulse just applied to determine the magnitude of the initial programming pulse, Vpgm_vstart, for future programming. In some embodiments, the magnitude of the programming pulse just applied is stored in step 924 and the offset is applied later. In other embodiments, the offset is used on the magnitude of the programming pulse just applied and the result is stored in step 924. In some embodiments, the magnitude of the programming pulse just applied or an identification of the pulse just applied are used to determine the magnitude of the initial programming pulse, Vpgm_vstart, for future programming using a mathematical formula or other means.

One advantage of using the pulse magnitude from step 924 is that if ΔVpgm2 is smaller than ΔVpgm1, then the resolution will be higher for the pulse magnitude stored at step 924. The process of FIG. 29 can be used with the embodiments discussed above, including the embodiments depicted in FIGS. 6-13.

The above descriptions provide examples of a system that will dynamically adapt the magnitude of the initial programming pulse based on previous programming processes. In some embodiments, the programming processes include multiple stages where the first stage will include setting the initial programming pulse magnitude for future stages. By programming a subsequent stage with the optimal initial magnitude, programming time can be shorter (less programming loops). In some prior systems that do not dynamically set the initial programming voltage as described above, the initial programming voltage is typically set much lower than optimum to have a margin for cycling and for programming speed variations within a device.

In some of the embodiments discussed above, the first programming stage used a larger step size (ΔVpgm) between programming pulses during the first stage in order to save programming time. However, to detect the most optimal initial programming voltage Vpgm_vstart for future stages, a smaller step size is desired as the subsequent stage is typically programmed with a smaller size. Using a smaller step size to determine Vpgm_vstart provides greater resolution. However, using a smaller step size also increase the time needed to perform programming Embodiments are discussed below that enable a higher resolution for Vpgm_vstart without the full time penalty for using a smaller step size. In one embodiment, when the required minimum number of memory cells have passed the first verify level VVvstart (or another condition) used to determine Vpgm_vstart for subsequent programming, one or more additional (or alternative) verify operations (to test for one or more alternative conditions) at different levels than the first verify level are carried out in order to increase the resolution with which the initial programming voltage Vpgm_vstart can be determined. In one example, one additional verify step is performed at a second verify level (e.g., Vvstart-2) that is different than Vvstart by an amount equal to half (or another fraction) of the current step size. In such a case, the new initial programming voltage can be determined with the resolution of $\Delta$Vpgm/2. In other embodiments, more than one additional verify operation can be done in order to further increase the resolution with which the initial programming voltage can be determined. One advantage of the technology is that step size during the first stage of programming does not have to be reduced in order to get higher resolution. The only increase in programming time is due to one or more additional verify operations, which does not increase the programming time too dramatically.

Figure 30:
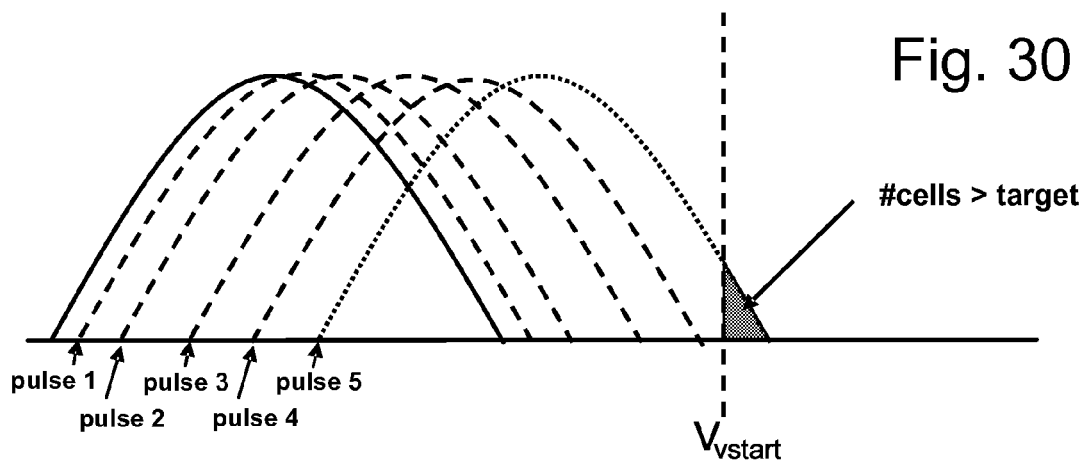
FIGS. 30-32 are graphs depicting threshold voltage distributions.

FIG. 30 shows a graphical representation of threshold voltage distribution movements in response to the first five programming pulses of the first stage of a programming process up to the point when the system detects the programming pulse magnitude to store in step 678 of FIG. 16. In the example of FIG. 30, five programming pulses have been applied until a sufficient number of memory cells (e.g., 15) have reached Vvstart. As can be seen, a number of memory cells, represented by the shaded region, have threshold voltages greater than Vvstart. The last programming pulse applied (the fifth programming pulse) has its magnitude stored as Vpgm_vstart, or is used to calculate Vpgm_vstart, in step 678.

Figure 31:
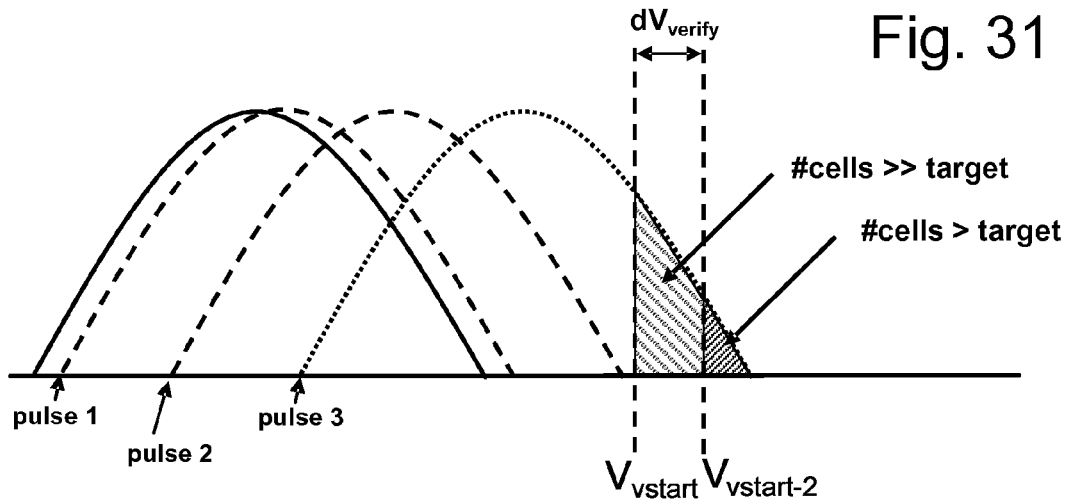

FIG. 31 shows a graphical representation of threshold voltage distribution movements in response to the first three programming pulses (pulse1, pulse2, pulse3) of a programming process up to the point where greater than N memory cells are detected to have threshold voltages greater than Vvstart. In this case, there also happens to be greater than N memory cells having threshold voltages greater than Vvstart-2. In this case one or more additional/alternative verify operations are performed. For example, one additional/alternative verify operation can be performed at Vstart-2 (an alternative result). When that additional/alternative verify operation is performed, it is determined that more than N memory cells have threshold voltages greater than Vvstart-2. In this example, Vvstart is greater than Vvstart-2 by $\Delta$Vpgm/2 (although other values are possible). In that case, the programming pulse magnitude used to determine the initial programming voltage Vpgm_vstart for the subsequent stage will be decreased from the magnitude of pulse 3 by $\Delta$Vpgm/2 (although other values are possible). That is, the value stored to be the next initial programming pulse magnitude is equal to or defined by the magnitude of the third programming pulse minus $\Delta$verify, with $\Delta$verify defined as the difference between the two verify levels Vvstart and Vvstart-2.

Figure 32:
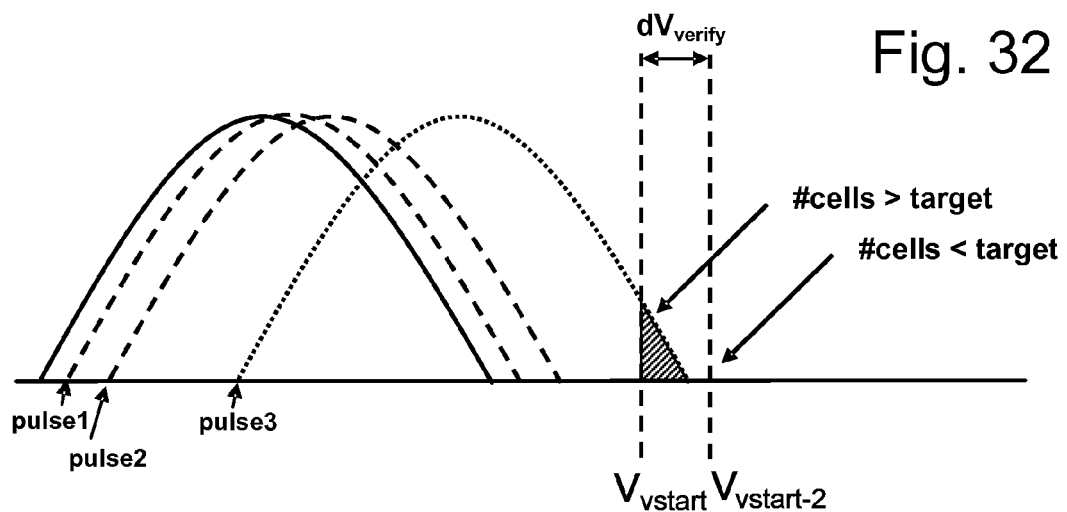

FIG. 32 provides another example for a set of memory cells that are slower to program than the example of FIG. 31. In this example, after the third programming pulse (pulse3), a sufficient number of memory cells have passed the Vvstart, however, an insufficient number of memory cells have passed Vvstart-2. Therefore, the programming pulse magnitude use to determine the initial programming voltage Vpgm_vstart for the subsequent stage will be the magnitude of the second programming pulse.

In other embodiments, more than one additional/alternative verify operation can be used in order to further increase the resolution with which the initial programming pulse can be determined. For example, the system can test the memory cells to determine whether greater than N (or another number) memory cells have a threshold voltage greater than Vvstart-2 and Vvstart-3, wherein the difference between the two verify levels Vvstart and Vvstart-2 is $\Delta$Vpgm/3 and the difference between the two verify levels Vvstart-2 and Vvstart-3 is also $\Delta$Vpgm/3. So, the difference between the two verify levels Vvstart and Vvstart-3 is $(2)*\Delta$Vpgm/3. If X additional/alternative verify operations are used, then the system will verify at Vvstart, Vvstart-2, Vvstart-3, . . . Vvstart-X, wherein Vvstart-X differs from Vvstart by $(X)*\Delta$Vpgm/$(1+X)$.

The advantage of this technology is the step size of the programming pulses during the first stage of programming does not have to be reduced. The same step size as without doing this technology can be used and, thus, there is no increase in the number of programming loops for the first stage.

In some embodiments, Vvstart is the verify level of the lowest threshold voltage distribution (e.g., distribution A) to be programmed during the first stage. In some embodiments, Vvstart-2 is the verify level of the lowest threshold voltage distribution (e.g., distribution A) to be programmed during the first stage while Vvstart is lower than the verify level of the lowest threshold voltage distribution. In other embodiments, Vvstart and Vvstart-2 can both be lower than the verify level of the first distribution. In some embodiments, Vvstart is the lowest verify level used in coarse/fine programming of the lowest threshold voltage distribution to be programmed during the first stage while Vvstart-2 can be equal to the verify level of the lowest threshold voltage distribution to be programmed during the first stage. After the initial programming magnitude is detected for future programming stages, it is possible to continue programming with the same step size to program distributions equal to or greater than Vvstart-2. In some cases, it may be desired to reduce the step size after the detection of the initial programming pulse to allow for more accurate programming. The technologies described herein can be combined with the processes of U.S. Pat. No. 7,092,290.

Figure 33:
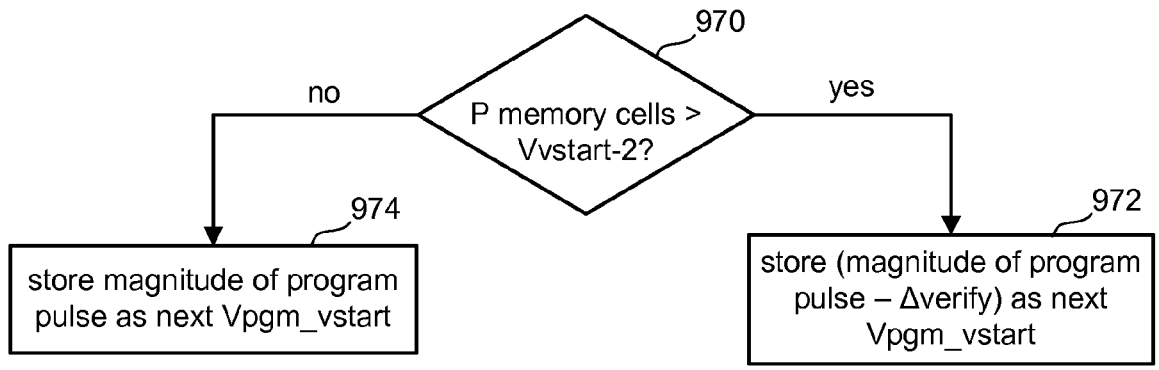
FIG. 33 is a flow chart describing one embodiment of a process for sensing information about a group of non-volatile storage elements.

The technology described above for using an additional/alternative verify level to increase resolution can be used with the process of FIG. 16. FIG. 33 is a flow chart describing a process to be added to FIG. 16. The steps depicted in the flow chart of FIG. 33 replace step 678 of FIG. 16. For example, after step 670 of FIG. 16 determined that N or more memory cells have threshold voltages greater than Vvstart, the process continues at step 970 of FIG. 33. In step 970, the system determines whether P or more memory cells have a threshold voltage greater than Vvstart-2 (where P can be the same or different than N). If P or more memory cells have a threshold voltage greater than Vvstart-2, then in step 972, the magnitude used to determine the next Vpgm_vstart is (the magnitude of the last pulse applied)−($\Delta$verify). Step 972 includes storing (the magnitude of the last pulse applied)−($\Delta$verify), as discussed above with respect to step 678. Alternatively, step 972 includes storing (the magnitude of the last pulse applied)−($\Delta$verify)+(offset). In another alternative, the system can store another function of (the magnitude of the last pulse applied)−($\Delta$verify), a function of an identification of the last pulse applied and Δverify, a function of an identification of the last pulse applied and Δverify, or some combination or subset of the above. Values other than Δverify can also be used. After step 972, the process continues at step 692 of FIG. 16.

If, in step 970, it is determined that there are not P memory cells with a threshold voltage greater than Vvstart-2, then in step 974, the magnitude used to determine the next Vpgm_vstart is the magnitude of the last pulse applied. Step 974 includes storing the magnitude of the last pulse applied, as discussed above with respect to step 678. Alternatively, step 972 includes storing (the magnitude of the last pulse applies)+(offset). In another alternative, the system can store another function of the magnitude of the last pulse applied, an identification of the last pulse applied, a function of an identification of the last pulse applied, or some combination or subset of the above. After step 974, the process continues at step 692 of FIG. 16.

Similarly, step 924 of FIG. 29 can be replaced with the process of FIG. 33. That is, if M memory cells have been locked out, the process will continue at step 970. After steps 972 or 974, the process continues at step 926 of FIG. 29.

Figure 34:
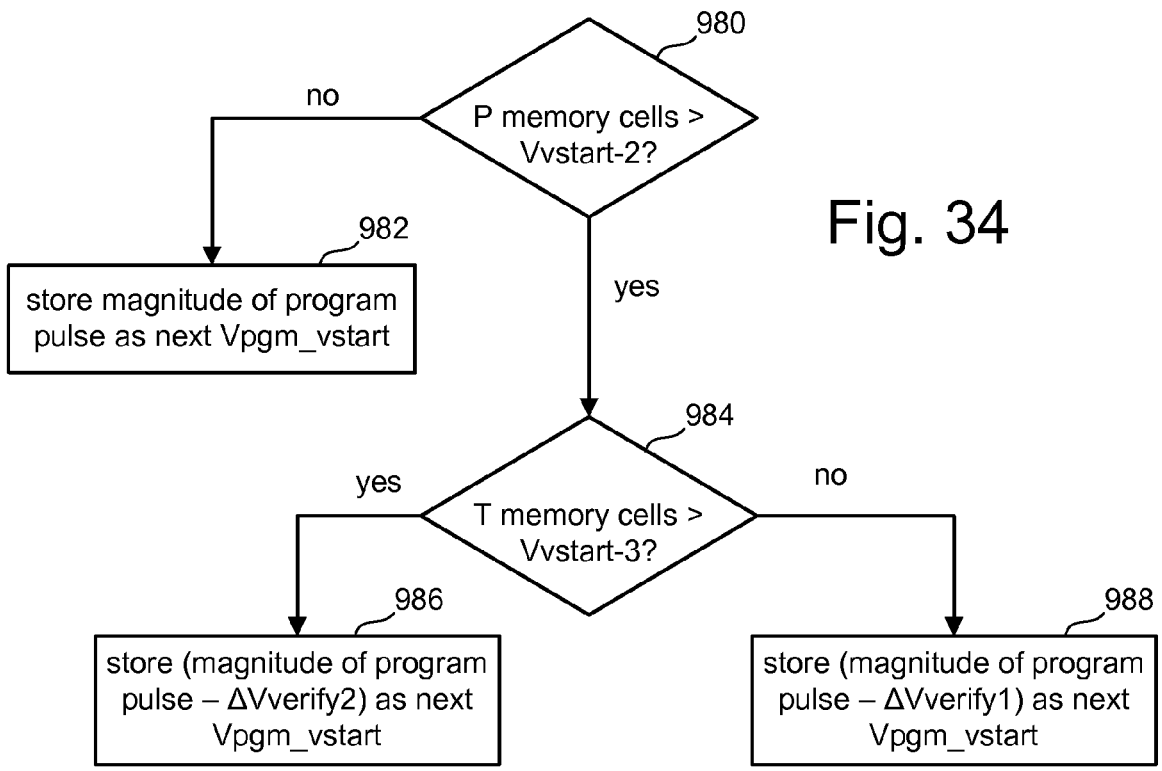
FIG. 34 is a flow chart describing one embodiment of a process for sensing information about a group of non-volatile storage elements.

FIG. 34 is a flow chart describing a process to be added to FIG. 16 when the system performs two extra verify operations to test for two alternative results. Note that the process of FIG. 34 can be adapted to test for more than two alternative results. The steps depicted in the flow chart of FIG. 34 replace step 678 of FIG. 16. For example, after step 670 of FIG. 16 determines that N or more memory cells have threshold voltages greater than Vvstart, the process continues at step 980 of FIG. 34. In step 980, the system determines whether P or more memory cells have a threshold voltage greater than Vvstart-2 (where P can be the same or different than N). If it is determined that there are not P memory cells with a threshold voltage greater than Vvstart-2, then in step 982 the magnitude or pulse used to determine the next Vpgm_vstart is the magnitude of the last pulse applied. Step 982 includes storing the magnitude of the last pulse applied, as discussed above with respect to step 678. Alternatively, step 982 includes storing (the magnitude of the last pulse applies)+(offset). In another alternative, the system can store another function of the magnitude of the last pulse applied, an identification of the last pulse or a function of the identification of the last pulse. After step 982, the process continues at step 692 of FIG. 16.

If P or more memory cells have a threshold voltage greater than Vvstart-2, then, in step 984, it is determined whether T or more memory cells have a threshold voltage greater than Vvstart-3. The value of T can be the same or different than N. If it is determined that there are not T memory cells with a threshold voltage greater than Vvstart-3, then in step 988 the magnitude used to determine the next Vpgm_vstart (the magnitude of the last pulse applied)−(Δverify1). Step 986 includes storing (the magnitude of the last pulse applied)−(Δverify1), as discussed above with respect to step 678. Alternatively, step 988 includes storing (the magnitude of the last pulse applies)−(Δverify1)+(offset). In another alternative, the system can store another function of the (the magnitude of the last pulse applied)−(Δverify1), a function of an identification of the last pulse and (Δverify1), a function of an identification of the last pulse and (Δverify1), or some combination or subset of the above. Values other than Δverify1 can also be used. After step 988, the process continues at step 692 of FIG. 16. In this embodiment, Δverify1 is defined as the difference between Vvstart and Vvstart-2.

If it is determined that there are T or more memory cells with a threshold voltage greater than Vvstart-3, then in step 986 the magnitude used to determine the next Vpgm_vstart is (the magnitude of the last pulse applied)−(Δverify2). Step 986 includes storing (the magnitude of the last pulse applied)−(Δverify2), as discussed above with respect to step 678. Alternatively, step 986 includes storing (the magnitude of the last pulse applies)−(Δverify2)+(offset). In another alternative, the system can store another function of the (the magnitude of the last pulse applied)−(Δverify2), an identification of the last pulse and (Δverify2), a function of and an identification of the last pulse and (Δverify2), or come combination or subset thereof. After step 986, the process continues at step 692 of FIG. 16. In this embodiment, Δverify2 is defined as the difference between Vvstart and Vvstart-3.

Similarly, step 924 of FIG. 29 can be replaced with the process of FIG. 34. That is, if M memory cells have been locked out, the process will continue at step 980. After steps 982, 986 or 988, the process continues at step 926 of FIG. 29.

The processes of FIG. 33 or FIG. 34 can be used with the processes of FIG. 29 or FIG. 16 to implement any of the programming schemes discussed above. In one example where the process of FIG. 33 or FIG. 34 can be used with the process of FIG. 29 to implement the programming scheme of FIGS. 8A-C, a first programming stage can include programming to a threshold voltage Vvb' and determining a new value for Vpgm_vstart. The second stage can use the process of FIG. 29 to program to the A, B and C state, as depicted in FIG. 8C, using the Vpgm_vstart (with an offset) from the first stage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method of programming non-volatile storage, comprising:

programming a first set of non-volatile storage elements to a first set of one or more target conditions using a first set of programming pulses, and completing the programming of the first set of non-volatile storage elements to the first set of one or more target conditions prior to starting programming of other non-volatile storage elements after starting the programming of the first set of non-volatile storage elements to the first set of one or more target conditions;

during the programming of the first set of non-volatile storage elements to the first set of one or more target conditions, determining that at least a subset of the first set of non-volatile storage elements have reached a first intermediate condition in response to a nth programming pulse of the first set of programming pulses and decreasing pulse magnitude increment for the first set of programming pulses for additional programming using the first set of programming pulses to complete the programming of the first set of non-volatile storage elements to the first set of one or more target conditions;

storing an indication based on the nth programming pulse; and after completing the programming of the first set of non-volatile storage elements to the first set of one or more target conditions, programming one or more non-volatile storage elements to a second set of one or more target conditions using a second set of programming pulses, the second set of programming pulses includes a first pulse having a magnitude based on the stored indication.

2. A method according to claim 1, wherein:
the first set of one or more target conditions are threshold voltage distributions; and
the first set of non-volatile storage elements are multi-state flash memory devices.

3. A method according to claim 1, wherein:
the first set of non-volatile storage elements include the one or more non-volatile storage elements;
the first set of non-volatile storage elements are connected to a common control line and the programming of the first set of non-volatile storage elements includes applying the first set of programming pulses to the common control line; and
the programming one or more non-volatile storage elements to the second set of one or more target conditions includes applying the second set of programming pulses to the common control line.

4. The method according to claim 3, wherein:
the first set of one or more target conditions are targets for a first programming process to program first user data; and
the second set of one or more target conditions are targets for a second programming process to program second user data.

5. The method according to claim 3, wherein:
the second set of one or more target conditions are final target data states for a programming process; and
the first set of one or more target conditions are targets for a first step of the programming process.

6. The method according to claim 1, further comprising:
the first set of non-volatile storage elements include the one or more non-volatile storage elements; and
after completing the programming of the one or more non-volatile storage elements to the second set of one or more target conditions, programming the one or more non-volatile storage elements to a third set of one or more target conditions using a third set of programming pulses, the third set of programming pulses includes a first pulse having a magnitude based on the stored indication.

7. The method according to claim 1, further comprising:
the first set of non-volatile storage elements are different than the one or more non-volatile storage elements;
the first set of non-volatile storage elements are connected to a first control line;
the one or more non-volatile storage elements are connected to second control line that is different than the first control line;
the programming of the first set of non-volatile storage elements includes applying the first set of programming pulses to the first control line; and
the programming one or more non-volatile storage elements to the second set of one or more target conditions includes applying the second set of programming pulses to the second control line.

8. The method according to claim 1, wherein:
the programming of the first set of non-volatile storage elements is a coarse programming stage; and
the programming one or more non-volatile storage elements to the second set of one or more target conditions is a fine programming stage.

9. The method according to claim 1, wherein:
the programming of the first set of non-volatile storage elements and the programming one or more non-volatile storage elements to the second set of one or more target conditions are different stages of a multi-stage programming process; and
at least a subset of the one or more non-volatile storage elements are part of the first set of non-volatile storage elements.

10. The method according to claim 1, wherein:
the first set of one or more target conditions correspond to one or more high data states;
the first second set of one or more target conditions correspond to one or more low data states;
the programming of the first set of non-volatile storage elements and the programming of the one or more non-volatile storage elements are different stages of a multi-stage programming process;
the programming of the first set of non-volatile storage elements is an earlier stage of the multi-stage programming process;
the programming one or more non-volatile storage elements is a later stage of the multi-stage programming process; and
the first set of non-volatile storage elements are different than the one or more non-volatile storage elements.

11. The method according to claim 1, wherein:
the first set of non-volatile storage elements include the one or more non-volatile storage elements
the programming of the first set of non-volatile storage elements and the programming of the one or more non-volatile storage elements are different stages of a multi-stage programming process;
the programming of the first set of non-volatile storage elements is an earlier stage of the multi-stage programming process;
the programming of the one or more non-volatile storage elements is a later stage of the multi-stage programming process; and
the method further includes programming non-volatile storage elements other than the first set of non-volatile storage elements subsequent to the earlier stage of the multi-stage programming process and prior to the later stage of the multi-stage programming process.

12. The method according to claim 1, wherein:
the programming of the first set of non-volatile storage elements and the programming of the one or more non-volatile storage elements are different stages of a multi-stage programming process;
the programming of the first set of non-volatile storage elements is an earlier stage of the multi-stage programming process;
the programming one or more non-volatile storage elements is a later stage of the multi-stage programming process; and
the method further includes programming non-volatile storage elements other than the first set of non-volatile storage elements and the one or more non-volatile storage elements subsequent to the earlier stage of the multi-stage programming process and prior to the later stage of the multi-stage programming process.

13. A non-volatile storage apparatus, comprising:
a plurality of non-volatile storage elements; and
one or more managing circuits in communication with the plurality of non-volatile storage elements, the one or more managing circuits apply programming pulses with a first increment between pulses to a set of the nonvolatile storage elements and determine that at least a first subset of the set of non-volatile storage elements have reached a first threshold voltage level in response to a nth programming pulse, the one or more managing circuits store an indication based on the nth programming pulse, the one or more managing circuits apply programming pulses with a second increment between pulses to the set of non-volatile storage elements until a sufficient number of the set of non-volatile storage elements have reached one or more respective target conditions, the first increment between pulses is larger than the second increment between pulses, the first threshold voltage level is lower than threshold voltage levels used to lockout non-volatile storage elements from programming, the one or more managing circuits perform another programming process for one or more non-volatile storage elements using a set of programming pulses having a first pulse with a magnitude based on the stored indication.

14. The non-volatile storage apparatus of claim 13, further comprising:
a word line in communication with the one or more managing circuits and the set of the non-volatile storage elements, the one or more managing circuits apply the programming pulses with the first increment between pulses to the word line, the one or more managing circuits perform the another programming process by applying the set of programming pulses to the word line, the set of non-volatile storage elements include the one or more non-volatile storage elements.

15. The non-volatile storage apparatus of claim 13, further comprising:
a first word line in communication with the one or more managing circuits and the set of the non-volatile storage elements, the one or more managing circuits apply the programming pulses with the first increment between pulses to the first word line; and
a second word line in communication with the one or more managing circuits and the one or more non-volatile storage elements, the one or more managing circuits perform the another programming process by applying the set of programming pulses to the second word line, the set of non-volatile storage elements are different than the one or more non-volatile storage elements.

16. The non-volatile storage apparatus of claim 13, wherein:
the set of non-volatile storage elements include the one or more non-volatile storage elements; and
after the one or more managing circuits perform the another programming process for the one or more non-volatile storage elements, the one or more managing circuits perform an additional programming process for the one or more non-volatile storage elements using new programming pulses having a first pulse with a magnitude based on the stored indication of the magnitude of the nth programming pulse.

17. The non-volatile storage apparatus of claim 13, wherein:
the set of non-volatile storage elements include the one or more non-volatile storage elements;
the one or more managing circuits apply the programming pulses with the first increment between pulses and apply the programming pulses with the second increment between pulses as part of an earlier stage of a multi-stage programming process for the set of non-volatile storage elements; and the one or more managing circuits perform the another programming process for the one or more non-volatile storage elements as part of a later stage of the multi-stage programming process for the set of non-volatile storage elements.

18. The non-volatile storage apparatus of claim 17, wherein:
the one or more managing circuits program non-volatile storage elements other than the set of non-volatile storage elements subsequent to the earlier stage of the multi-stage programming process and prior to the later stage of the multi-stage programming process.

19. The non-volatile storage apparatus of claim 13, wherein:
the one or more managing circuits apply the programming pulses with the first increment between pulses and apply the programming pulses with the second increment between pulses as part of an earlier stage of a multi-stage programming process for the plurality of non-volatile storage elements;
the one or more respective target conditions correspond to one or more high data states for the multi-stage programming process; and
the one or more managing circuits perform the another programming process for the one or more non-volatile storage elements as part of a later stage of the multi-stage programming process, the later stage includes programming the one or more non-volatile storage elements to one or more low data states.

20. The non-volatile storage apparatus of claim 13, wherein:
the plurality of non-volatile storage elements are multi-state flash memory devices.

21. A method of programming non-volatile storage, comprising:
performing a first stage of a multi-stage programming process on a set of non-volatile storage elements, the multi-stage programming process programs the set of non-volatile storage elements to one or more final target conditions, the first stage programs the non-volatile storage elements to one or more first stage target conditions, the performing of the first stage includes:
applying a first set of programming pulses to the non-volatile storage elements with a first increment between programming pulses,
determining that at least a subset of the non-volatile storage elements have reached an intermediate condition for the first stage in response to a nth programming pulse of the first set of programming pulses, the intermediate condition for the first stage is different than the one or more first stage target conditions,
changing the first set of programming pulses to have a second increment between programming pulses in response to determining that the subset of the non-volatile storage elements have reached the intermediate condition for the first stage, the second increment between programming pulses is smaller than the first increment between programming pulses,
storing an indication based on the nth programming pulse, and
terminating the first stage when a sufficient number of the non-volatile storage elements have reached the respective one or more first stage target conditions; and
performing an additional stage of the multi-stage programming process including applying a second set of programming pulses having an initial pulse with a magnitude set based on the stored indication.

22. A method according to claim 21, further comprising:
performing another stage of the multi-stage programming process including applying a third set of programming pulses having an initial pulse with a magnitude set based on the stored indication.

23. A method of programming non-volatile storage, comprising:
applying programming pulses with a first increment between pulses to a set of non-volatile storage elements;
determining that at least a first subset of the set of non-volatile storage elements have reached a first threshold voltage level;
in response to determining that at least the first subset of the set of non-volatile storage elements have reached the first threshold voltage level, applying programming pulses with a second increment between pulses to the set of non-volatile storage elements until a sufficient number of the set of non-volatile storage elements have reached one or more respective target conditions, the first increment between pulses is larger than the second increment between pulses, the first threshold voltage level is lower than threshold voltage levels used to lockout non-volatile storage elements from programming; and
performing another programming process for one or more non-volatile storage elements using a set of programming pulses having a first pulse with a magnitude based on the determining that at least the first subset of the set of non-volatile storage elements have reached the first threshold voltage level.

24. The method according to claim 23, wherein:
the applying of programming pulses to the set of non-volatile storage elements and the programming process for the one or more non-volatile storage elements are different stages of a multi-stage programming process;
the applying of programming pulses to the set of non-volatile storage elements is an earlier stage of the multi-stage programming process;
the programming process for the one or more non-volatile storage elements is a later stage of the multi-stage programming process;
the set of non-volatile storage elements includes the one or more non-volatile storage elements; and
the method further includes programming non-volatile storage elements other than the set of non-volatile storage elements subsequent to the earlier stage of the multi-stage programming process and prior to the later stage of the multi-stage programming process.

25. The method according to claim 23, wherein:
the applying of programming pulses to the set of non-volatile storage elements and the programming process for the one or more non-volatile storage elements are different stages of a multi-stage programming process;
the applying of programming pulses to the set of non-volatile storage elements is an earlier stage of the multi-stage programming process;
the programming process for the one or more non-volatile storage elements is a later stage of the multi-stage programming process; and
the method further includes programming non-volatile storage elements other than the set of non-volatile storage elements and the one or more non-volatile storage elements subsequent to the earlier stage of the multi-stage programming process and prior to the later stage of the multi-stage programming process.

26. A non-volatile storage apparatus, comprising:
a plurality of non-volatile storage elements; and
one or more managing circuits in communication with the plurality of non-volatile storage elements, the one or more managing circuits use a first set of programming pulses to program a set of the plurality of non-volatile storage elements to a first set of one or more target conditions associated with the first set of programming pulses, during the programming of the set of non-volatile storage elements to the first set of one or more target conditions the one or more managing circuits determine that at least a subset of the first set of non-volatile storage elements have reached a first intermediate condition with respect to the first set of programming pulses in response to a particular programming pulse of the first set of programming pulses and decrease increment between pulses for the first set of programming pulses during continued programming of the set of non-volatile storage elements to the first set of one or more target conditions, the one or more managing circuits store an indication based on the particular programming pulse, and the one or more managing circuits program one or more of the plurality of non-volatile storage elements to a second set of one or more target conditions using a second set of programming pulses, the second set of programming pulses has a first pulse with a magnitude based on the stored indication.

27. The non-volatile storage apparatus of claim 26, wherein:
the one or more managing circuits program other non-volatile storage elements after the one or more managing circuits use the first set of programming pulses to program the set of non-volatile storage elements to the first set of one or more target conditions and before the one or more managing circuits program the one or more non-volatile storage elements to the second set of one or more target conditions using the second set of programming pulses.

28. The non-volatile storage apparatus of claim 26, further comprising:
a word line in communication with the one or more managing circuits, the word line is connected to the set of non-volatile storage elements and the one or more non-volatile storage elements; and
a set of bit lines in communication with the one or more managing circuits, the set of bit lines are connected to the set of non-volatile storage elements and the one or more non-volatile storage elements, the one or more managing circuits apply the first set of programming pulses to the word line, the one or more managing circuits apply the second set of programming pulses to the word line.

29. A method of programming non-volatile storage, comprising:
performing a first stage of a multi-stage programming process on a set of non-volatile storage elements, the multi-stage programming process programs the set of non-volatile storage elements to one or more final target conditions, the first stage programs a plurality of the non-volatile storage elements to one or more first stage target conditions, the performing of the first stage includes:
applying a first set of programming pulses to the plurality of the non-volatile storage elements with a first increment between programming pulses,
determining that at least a subset of the plurality of the non-volatile storage elements have reached an intermediate condition for the first stage, the intermediate condition for the first stage is different than the one or more first stage target conditions, changing the first set of programming pulses to have a second increment between programming pulses in response to determining that the subset of the non-volatile storage elements have reached the intermediate condition for the first stage, the second increment between programming pulses is smaller than the first increment between programming pulses, determining that a sufficient number of the plurality of the non-volatile storage elements have reached the one or more first stage target conditions, terminating the first stage, and storing an indication of a programming pulse applied immediately prior to determining that the sufficient number of the plurality of the non-volatile storage elements have reached the one or more first stage target conditions; and performing an additional stage of the multi-stage programming process including applying a second set of programming pulses to a group of the non-volatile storage elements, the second set of programming pulses has an initial pulse with a magnitude based on the stored indication.

30. The method of claim 29, wherein:

the first stage programs the plurality of set of non-volatile storage elements to a high data state;

the additional stage programs the group of the non-volatile storage elements to one or more low data state; and the plurality of non-volatile storage elements and the group of non-volatile storage elements are connected to a common word line;

the first set of programming pulses are applied to the common word line; and the second set of programming pulses are applied to the common word line.

* * * * *